United States Patent [19]

Bender

[11] Patent Number: 5,103,188
[45] Date of Patent: Apr. 7, 1992

[54] BUFFERED TRANSCONDUCTANCE AMPLIFIER

[76] Inventor: Gregory Bender, Studio 14, 2934 Ford St., Oakland, Calif. 94601

[21] Appl. No.: 389,735

[22] Filed: Aug. 4, 1989

[51] Int. Cl.$^5$ ............................................... H03F 3/30
[52] U.S. Cl. .................................... 330/265; 330/257; 330/267
[58] Field of Search ............... 330/257, 265, 267, 268, 330/273, 274, 288, 297

[56] References Cited

U.S. PATENT DOCUMENTS 4,555,672  11/1985  Segal .............................. 330/265 X

FOREIGN PATENT DOCUMENTS 1246338  7/1986  U.S.S.R. ............................... 330/288

Primary Examiner—James B. Mullins

[57] ABSTRACT

An electrical circuit for amplifying complex, wideband signals, preferably audio and servo/robotic signals, comprises a first input buffer in an emitter-follower configuration or in a source-follower configuration. A bias current rail traverses the first buffer. The low impedance output of the first buffer is connected to a load resistor, preferably in the order of 50–500 ohms. The circuit further comprises positive and negative opposing current mirrors connected to the bias current rail that reflect the currents created in the bias current rail by an input voltage signal imposed across the load resister. The combined outputs of the current mirrors are connected to the input of a second buffer. The output of the second buffer is connected via a feedback means to the output of the first buffer and to a load. The first buffer is driven by dual voltage supply rails, preferably a lower voltage, in the order of 15 Volts. Higher dual voltage supply rails for the second buffer and the opposing current mirrors, typically at least 50 to 70 Volts, are used for power amplifiers. The present invention provides an amplifier which can amplify complex, high speed, wideband signals without slew rate, overshoot, or ringing and still maintain a large degree of linearity with increasing input overdrive. It is capable of unprecedented high frequency response and phase stability without any need for typical compensation techniques.

52 Claims, 11 Drawing Sheets

1. DIFFERENTIAL PAIR

BUFFERED TRANSCONDUCTANCE AMPLIFIER

FIELD OF THE INVENTION

The present invention relates to amplifiers and more specifically to audio and servo/robotic amplifiers. The invention relates more particularly to means for amplifying signals of complex, wideband waveshapes without distortion and a method for eliminating slew rate and slew rate distortions in an amplifier.

BACKGROUND OF THE INVENTION

Presently, modern power, principally operational amplifiers and other amplifiers incorporating a differential pair configuration have an inherent slew rate limit which limits their performance as the output signal approaches an upper frequency limit. This slew rate induces distortion in the amplifier, often designated as slew induced distortion (SID) or transient intermodulation distortion (TIM) throughout the audio industry. If the signal is an audio signal, this slew rate distortion affects the acoustic quality of the output signal. In particular, modern stereo equipments all comprise an amplification stage. The sound quality of such a stereo equipment has been increasingly improved in the past decade. However, the slew rate distortion cruelly limits further improvements which can be brought to the sound quality.

A complete study of slew rate distortion, in particular in connection with audio signals, can be found in an article by Walter G. Jung, et al., "An Overview of SID and TIM," Audio, June 1979. This article is incorporated herein by reference.

Slew rate elimination is an issue which has been addressed in numerous patents and articles. One of the reasons which seems to account for the slew rate distortion of modern amplifiers, in particular of amplifiers presently used in audio equipments, resides in the topological structure of the amplifiers used therein. The person skilled in the art will recognize that most modern operational amplifiers utilize a differential pair in their input stage. Differential pairs are well known in the art and are one of the most elementary building blocks of the analog electronics industry. A differential pair can also be found at the heart of the common flip-flop, an important building block in digital electronics. It has been relied on as a veritable cornerstone throughout the electronics industry.

The differential pair is typically comprised of two transistors or active devices arranged in a mutually exclusive "see-saw" configuration. Applying a signal which turns on the first device, simultaneously turns off the second device and vice versa. It is quite linear around the 50%/50% center balancing region. However, its linearity drops off quickly, and often severely, on either side of the balance region.

Reference is now made to FIG. 1 which is a circuit diagram of a differential pair. A differential pair typically comprises a pair of transistors $Q_A$ and $Q_B$. The base of the transistor $Q_A$ is connected to a first terminal 1, to which is applied a tension $V_A$ whereas the base of the transistor $Q_B$ is connected to a second terminal 3 to which is applied a tension $V_B$. The transistors $Q_A$ and $Q_B$ have their emitters connected together at a node 4 to the terminal 5 to which a voltage $-V$ is applied. A voltage V is applied between the two sources of the transistors $Q_A$ and $Q_B$. A constant current source 7 drives a current $I_A$ through the transistor $Q_A$ and a current $I_B$ through the transistor $Q_B$, respectively, by means of a current rail 9 and a current rail 11. Two stray capacitances $C_1$ and $C_2$, designated by the numerals 13 and 15, are connected between the rails 9, 11 and ground. The total current flowing through node 4 and the terminal 5 designated as $I_{bias}$, typically in the order of 1 mA, is simply the sum of $I_A$ and $I_B$. When the voltage $V_A$ is applied at the terminal, it turns on the transistor $Q_A$ which pulls more current $I_A$ down on the rail 9 because of the high input impedance and current gain of the transistor $Q_A$. The increase of current $I_A$ provokes a rise in the voltage across the source-emitter of the transistor $Q_A$. As the base of the other transistor $Q_B$ is still grounded to the terminal 3, the emitter to base voltage of the transistor $Q_B$ is closed off. This property in a differential pair to shut off one transistor when the other transistor is turned on provides a linear balancing action at the center region. The function $I_A$ with respect to the voltage $V_A$ is basically non-linear with the exception of a narrow linear domain at the center and is schematically represented by the graph illustrated in FIG. 2a. The function is mathematically represented by the following equation:

$$I_A = I_o \tan h \left( V_A / V_o \right) \quad (1)$$

where $V_o$ and $I_o$ are both constants.

Typically, an amplifier, for example an operational amplifier comprises two stages: an input transconductance amplifier and an integrating amplifier. The transconductance amplifier generally comprises a differential pair. As long as the voltage $V_A$ remains less than a specific upper limit, the transconductance amplification function represented by Equation (1) remains remarkably linear. Usually, this upper limit to $V_A$ is about 50 mV and up to 100 mV in some amplifiers. Beyond this range, either in the positive or in the negative values, the current $I_A$ reaches a saturation plateau, either transistor is driven full on.

Until recently, this small linear region of the differential pair was assumed to be largely adequate for all types of signal processing. However, particular attention should be paid to the saturation regions of the differential pair, where the other transistor is driven completely off.

Referring to FIG. 2a again, when the current $I_{bias}$ reaches its maximum, for instance in the positive values, the transistor $Q_B$ is off while the transistor $Q_A$ saturates and latches up. No more input to output variations can be obtained in this non-linear region. At this point, slew rate distortion is generated by the constant current and the stray capacitance 13, 15 in this integrating stage of the amplifier. More specifically, the slew rate distortion is revealed by overshoots and ringing in the output signal as the differential pair tries to regain its center balancing point.

Reference is now made to FIG. 2b which illustrates how a high speed step signal is typically output by an amplifier comprising a differential pair. If a high speed step voltage $V_A$ is applied at the terminal 1, for instance, 10 volts, the transistor $Q_A$ is rapidly saturated and the current $I_A$ reaches a constant value, typically in the order of 100 mA. The point corresponding to the value of 10 Volts is designated by P in FIG. 2a. The integrating stage of the amplifier then integrates this constant value of $I_A$ and provides a voltage ramp which increases linearly with time. This ramp is indicated in FIG. 2b by the numeral 20. The inertia of the amplifier causes the voltage ramp to overshoot the actual value of the output voltage and subsequently ringing happens. As the differential pair amplifier settles down and balances, other overshoots may occur until the final output voltage reaches an equilibrium state. These overshoots are part of the slew rate distortion which the goal of the present invention is to eliminate. The integrating stage amplifier can be designed to reduce the portion of the step signal which is not adequately steep as compared with the input signal (trapezoidal edge). However, an improvement in the slope of the rising ramp may induce higher and more ringing overshoots 23. Alternatively, in order to avoid high overshoots, slow amplifiers can be used but they provide very slow, shallow trapezoidal rise times.

In addition to being non-linear for large input signals, the differential pair's saturation region causes serious stability problems. In both the audio and robotics/servo industries, there is a great deal of signal content containing instantaneous transients, which often exceed the linear region of the differential pair by several orders of magnitude. These transients are considered as large signals and generally move faster than the balancing action of the differential pair. These transients drive the differential pair well into saturation for a short, but definite period of time. If the transient is nearly the same speed as the balancing action of the differential pair, a dangerous phase shift can develop between the input and the feedback network, causing "run-away" oscillations.

Feedback compensation for high-frequency stability is generally necessary for both operational amplifiers and typical power amplifiers. The basic theory and practice of compensation for differential pair is centered around the concept of reducing the high-frequency, closed loop gain below unity before the internal phase shift reaches −180. This is where oscillations naturally start increasing if the gain seen at the inputs is greater than or equal to one. Compensation by its very nature severely restricts the high-frequency performance of typical amplifiers. Anyone skilled in the art of prior art operational amplifiers should be well aware of the need for high frequency feedback compensation.

The use of differential pairs in the audio technology has raised numerous problems which have not been yet resolved. The slew rate, which is caused by a saturated differential pair, severely limits the large signal bandwidth (BW) capabilities of typical amplifiers. Thus, the large signal bandwidth can never equal the small signal bandwidth. For this reason, any amplifier which comprises a differential pair configuration, has a dynamic frequency response that is inversely proportional to input signal levels. Thus, the greater the input, the narrower the bandwidth of the amplifier.

This is illustrated in FIG. 3a which shows how the large signal bandwidth is limited by slew rate for audio-signals. In FIG. 3a, the coordinates are respectively the frequency (abscissa in Hertz) and the power of the acoustic signal in decibels. Typically, a maximum steady state sound pressure level is in the order of 100–120 dB in ordinate. However, short impacts may be substantially louder, of the order of 160 dB. The large signals are adequately covered up to 500 Hz. This portion is designated by the numeral 27. The small signal bandwidth, designated by the numeral 28, does not show a slew rate limited response. However, higher frequencies for large signals are inadequately covered due to the slew rate limitations. The slew rate curve portion is indicated by the numeral 29. This causes the amplifier's sonic characteristics to continually change throughout loud musical passages, resulting in the rather harsh or cold metallic sound that typical solid state amplifiers are known for.

Another serious problem arises as signal levels increase. Low level texture and ambience are literally erased, as the differential pair is driven into saturation, or effectively off, for a certain percentage of time during any given crescendo. This causes a unique "comblike" eraser of the low level signals and ambience during loud musical passages. This explains why concert hall ambience is considered most difficult to record during a live performance. The current electronics being used have erased this ambience long before it reaches the tape machine. The subconscious ear can hear these minute, discontinuous, missing bits of background instruments, but can only translate this information to the conscious brain as stereo, not live music. The conscious ear is not fast enough to notice these missing sections.

Electron tubes have a saturation threshold which is generally 10 times greater than transistors. In addition, the saturation corners are much softer. These types of amplifiers can track larger transients before the effects of saturation are noticed, and the transition into saturation is more gradual. This accounts for the warmer, more realistic, or natural, sound of tube amplifiers, which many musicians still prefer over conventional transistor amplifiers. However, electron tubes are difficult to handle, expensive, fragile and cannot be miniaturized.

There is therefore a need in audio and servo/robotics for amplifiers which can handle complex wideband signals with no slew rate distortion, overshoot, or ringing, comprising inexpensive elements and simple to manufacture.

SUMMARY OF THE INVENTION

The present invention discloses an electrical circuit comprising a first buffer, as in FIG. 4a, comprising a single non-inverting input, an open loop voltage gain less than or equal to one, and an low impedance output, a first current rail traversing the first buffer. In FIG. 4b a pair of opposing current mirrors connected in series to the first current rail of the first buffer, a load resistor connected to the output of the first buffer, the combination of the first buffer, the opposing current mirrors and the load resistor forming a first input stage. The circuit further comprises a second buffer whose input is connected to a node, the node being connected to the output of said opposing current mirrors, and an output for driving any specific load, a second current rail traversing the second buffer, and a voltage supply rail for driving the current mirror, the first buffer and the second buffer, and a feedback line connecting the output of the second buffer with the first input stage. This contrasts from prior art, FIG. 3b, in that the input operational amplifier is no longer needed or used.

The first and second current mirrors are typically opposite to each other, the first current mirror operating for positive values of the buffer's output current and the second current mirror operating for negative values of the buffer's output current. The voltage supply rail preferably comprises a lower voltage supply for driving the first buffer and a higher voltage supply for driving the current mirror and the second buffer, as shown in FIG. 4c.

The circuit preferably comprises a voltage regulator for the lower voltage supply and a voltage regulator for the higher voltage supply. The load resistor for the first buffer typically has a resistance between 50 and 500 ohms. The fedback line is ideally connected back to the output of the first buffer or also back to the inputs of the current mirrors. In a preferred embodiment of the present invention, the first and second buffers are integrated circuit chips. The circuit of the present invention may also contain bias devices for preventing cross-over distortion in either or both buffers. The open loop voltage gain of the first and second buffers is defined as being less than or equal to one; making them emitter follower or source follower configurations only. The input impedance is typically high, whereas the output impedance is very low and the bandwidth is very wide. In addition, the first and second buffers have a single, non-inverting input only. The first buffer is intended to replace the differential pair input or the operational amplifier input common to prior art.

According to a second aspect of the present invention, there is disclosed an amplifier, as shown in FIG. 4b, comprising a first buffer, in an emitter-follower configuration or in a source-follower configuration, the first buffer comprising an input and an output, a first current rail traversing the first buffer, opposing current mirrors connected to the first current rail of the first buffer, a load resistor connected to the output of the first buffer, the combination of the first buffer, the opposing current mirrors and the load resistor forming a first input stage, a second buffer connected to a node, the node being connected to the output of opposing current mirrors, the second buffer comprising an input and an output, a second current rail traversing the second buffer, a voltage supply rail for driving the current mirror, the first buffer and the second buffer, and a feedback line connecting the output of the second buffer with the output of the first buffer stage.

The signals to be amplified are typically audio-signals or servo/robotic signals. The amplifier is typically a power amplifier but may be used in amplifying very low level signals if designed for such.

According to another aspect of the present invention, there is disclosed a cascaded amplifier, as shown in FIG. 4d, comprising a buffer, in an emitter-follower configuration or in a source-follower configuration, the buffer comprising an high impedance, non-inverting input and an low impedance output, a first current rail traversing the buffer, opposing current mirrors connected to the current rail of the buffer, a load resistor connected to the output of the buffer, the combination of the buffer, the current mirror and the load resistor forming a first input stage, at least another buffer connected to a node, the node being connected to the output of opposing current mirrors, the second buffer comprising an high impedance input and an low impedance output, the other buffer forming a second input stage with opposing current mirrors connected to the output node of the first pair of opposing current mirrors, a second current rail traversing the second buffer, and an overall voltage supply rail for driving the current mirrorrs, the first buffer and the second buffer, of this cascaded amplifier. This cascaded amplifier may comprise additional input stages consisting of buffers with opposing current mirrors forming additional stages in a continuous chain formation. In this way the open loop gain of the overall circuit can be increased many thousand times.

According to another aspect of the present invention, there is disclosed a method of amplifying a music or servo/robotic control signal without slew rate, comprising the steps of applying a voltage to the single input of a first buffer, applying a current rail through the first buffer, producing a current through a load resistor at the output of the first buffer, changing the intensity of the current traversing the current rail of the first buffer, reflecting the change of intensity in the current rail and through opposing current mirrors. The combination of the first buffer, the load resistor and the current mirrors forming a first input stage, outputting this change of intensity to the input of a second buffer, and providing overall feedback from the output of the second buffer for controlling the change of intensity at the first stage, so as to null the change of intensity in the current rail of the first buffer by a small percentage thereby increasing overall linearity and speed, and producing output step signals as shown in FIG. 9, with no slew rate, overshoot, ringing, or the need for high frequency compensation.

According to another aspect of the present invention, there is disclosed a method of eliminating the slew rate in an audio-signal or servo/robotic control signals, comprising the steps of applying a changing input voltage signal at the input of a first buffer, transforming the input voltage signal into a changing current signal at the output of the first buffer through a load resistor, adding the intensity of the changing current signal in a bias current rail going through the first buffer, reflecting the changing current signal through opposing current mirrors, applying this changing current output signal at the input of a second buffer, the second buffer being traversed by another current rail, and applying overall feedback from the output of the second signal to the output of the first buffer or the input of the current mirrors so as to null the change of current due to the input voltage signal by some percentage and producing output signals as shown in FIG. 9, with no slew rate, overshoot, ringing, or the need for high frequency compensation.

Although the amplifier of the present invention performs particularly well in audio applications, it can also be used in robotics/servo motor applications where large feedback voltage spikes are caused by the inductive switching of high currents from one motor coil to the next. This brush contact noise can generate spikes easily 10 times over the nominal motor voltage. These feedback transients latch up the differential pair of amplifiers of the prior art, causing the amplifier's output to slew in opposition to the transient. When the transient climbs faster than the opposite slew rate, the amplifier will fail to damp, or "sink" the transient's energy. Either oscillations or damage will result. The problems encountered are resolved by the amplifier of the present invention. What is not obvious to those skilled in the prior art is that the present invention completely eliminates the differential pair and related operational amplifiers, as well as slew rate, overshoot, ringing, SID, TIM, and high frequency compensation, throughout audio, and servo/robotic electronics.

These and other advantages and features of the present invention will become more fully apparent from the following description and appended claims taken in conjunction with the accompanying drawings.

DETAILED DESCRIPTION OF THE PREFERRED EMBODIMENT

The invention is best understood by reference to the figures wherein like parts are designated with like numerals throughout.

Figure 4A:
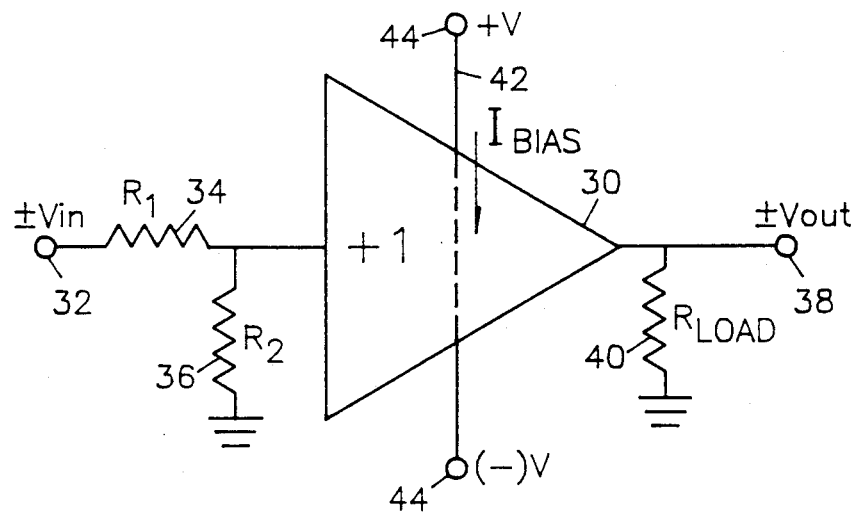
FIG. 4a illustrates a buffer according to the present invention.

Reference is now made to FIGS. 4a–4f, which are illustrations of preferred embodiments of the present invention. In FIG. 4a, there is illustrated a circuit comprising a buffer 30 having an open loop voltage gain less then or equal to +1 and driven with a bias current of intensity $I_{BIAS}$ (also in conjunction with $I_{drive}$). In the embodiment shown in FIG. 4a, the voltage gain of the buffer is +1. However, it will be understood by the person skilled in the art that any buffer with a single, non-inverting input; without any differential pairs; and having an open loop voltage gain less then or equal to +1 would also be adequate as an alternate embodiment of the present invention.

Figure 6A:
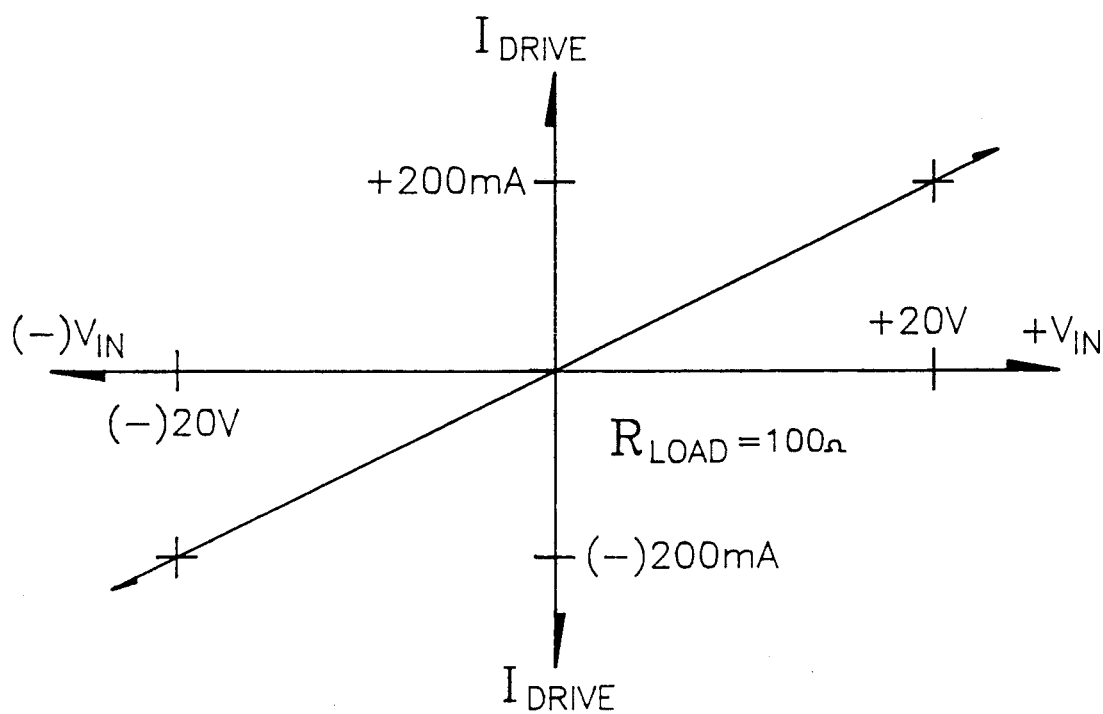
FIG. 6a is a graph showing the transfer function of $I_{drive}$ with respect to the input voltage according to the present invention.

In this configuration, the buffer 30 is set in an emitter-follower or in a source-follower configuration. The single, non-inverting input of the buffer 30 is connected to a voltage source 32 of voltage $V_{in}$ through a resistor 34 having a resistance $R_1$. Another resistor 36 having a resistance $R_2$ is connected to the output of the first resistor 34 and grounded. The output of the buffer 30 is connected to a load resistor 40 having a resistance $R_{load}$. The load resistor 40 sets the slope of the transfer function as shown in FIG. 6a. A bias rail 42 traverses the buffer 30 and is driven between a reference source 44 of voltage +V and a reference source 46 of voltage −V. A constant current source (not represented in FIG. 4a) with resistors 74, 72 drives the current $I_{BIAS}$ through the buffer 30. Typically, current mirrors are driven by the current $I_{BIAS}$ down through bias current rail 42. The noteworthy advantage of the buffer configurations represented in FIGS. 4a–4f, is that the output drive current is linear over a range which is at least 200 times greater than the average range obtained with differential pairs. Typical values for the resistors of the buffer circuit of FIG. 4 are as follows: 1 kiloohm for the resistor 34, 1 megohm for the resistor 36. The input impedance of the buffer is thus about 10 megohms and 10 pF. A typical input voltage is between +/−1 and +/−20 volts. The load resistor 40 has typically a value between 50 ohms and 500 ohms.

Figure 5:
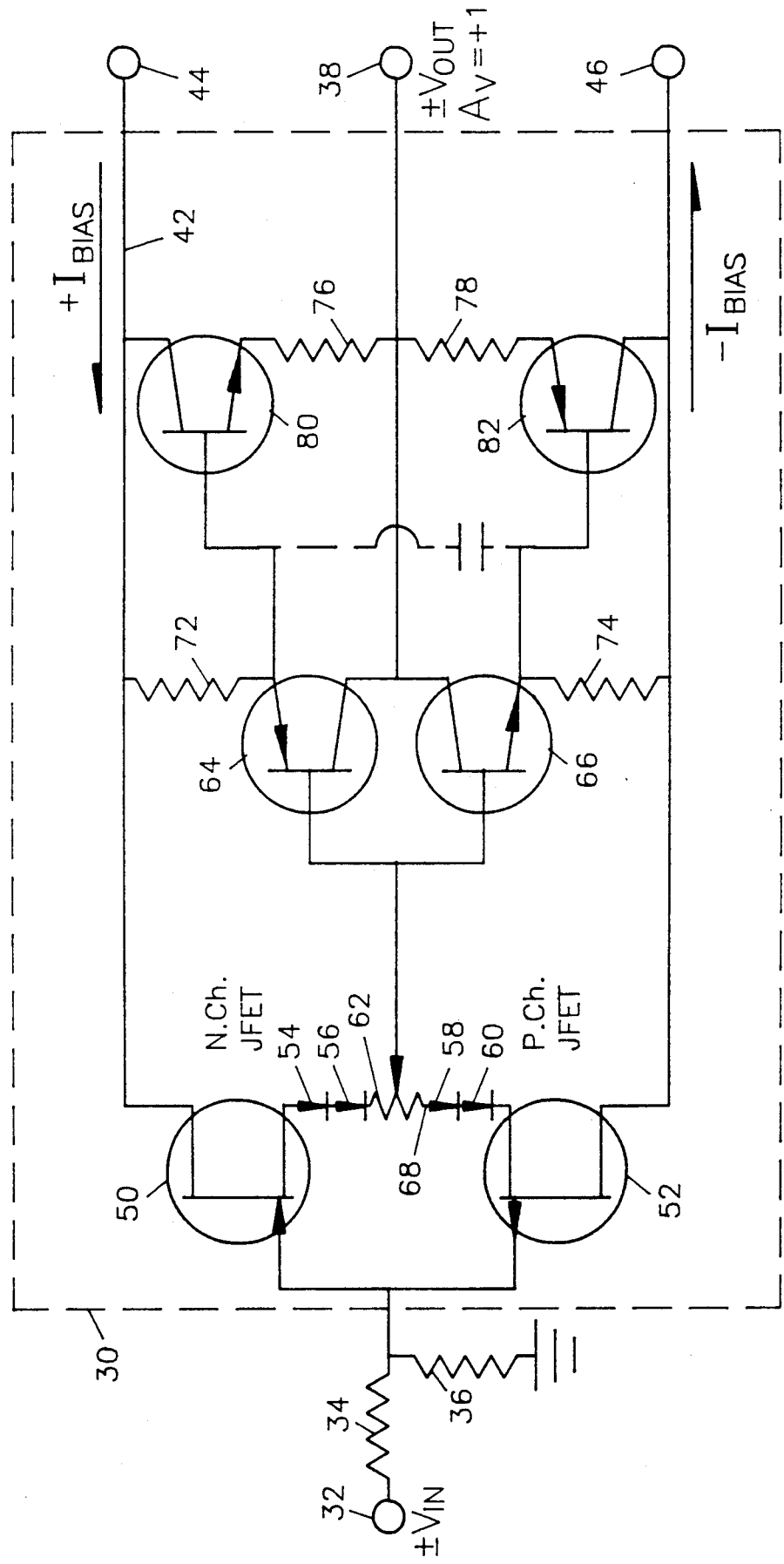
FIG. 5 is an exemplary circuit of a buffer as shown in FIG. 4.

Various embodiments of the buffer 30 are possible. Preferably, the buffer 30 is an integrated circuit chip readily available in the commerce. Two FETs are typically used for such a buffer to increase input impedance. An exemplary circuit of a buffer as shown in FIG. 4a is now illustrated in FIG. 5.

In this embodiment, the input stage of the buffer comprises two JFETs, an N channel JFET 50 and a P channel JFET 52. The JFETs 50 and 52 are connected to one another through a plurality of diodes 54, 56, 58 and 60 and an offset resistor/potentiometer 62. The FETs are further connected to transistors 64 and 66 via a node 68. Typically, these transistors 64 and 66 are located on an integrated chip circuit 70 commercially available such as MP06502 or LH0002, or other equivalents. The drive rails 44 and 46 are connected to both outputs of the FETs 50 and 52. Two resistors 72 and 74 connect the emitters of the transistors 64 and 66 to the drive current rails 44 and 46. The output of the chip 70 typically comprises a series of resistors 76 and 78 connected to the transistors 64 and 66 via two emitter-follower transistors 80 and 82. The bandwidth has typically a range between 2 and 100 Mhz.

The N- and P-channel JFET's 50 and 52 are preferably complementary. This type of buffer is quite performing for the embodiment of the present invention. It would, however, be apparent to the person skilled in the art that other types of buffers commercially available are also adequate as buffers in the circuit of the present invention.

Mode of Operation of the Input Buffer of the Present Invention

The circuit of FIG. 4a (and further illustrated in FIG. 5) differs from the traditional differential pairs inasmuch as it has a single input and an low impedance output stage. In the differential pair, two current drive outputs to to one rail only. In the buffer of the present invention, the complementary current drive outputs are opposite to each other. The bias current rail drives the running current or idling current without any input signal. If the device input is grounded, there is a net current going through the device but not out of the device. This current is considered to be a constant current and performs particular functions in the device. Because the configuration is a voltage follower, the input voltage source can be set at a particular voltage, for instance, +1 Volt, whereas the output voltage will follow at a comparable output voltage, for instance, +1 Volt. Also, because the load resistor has a resistance between 50 and 500 ohms, the net current going through the load resistor is either I. This current does not come from the input because it has a very high input impedance (10 megohms or more) but is provided through the current rail of the device. The essential function of the rail in the present invention is to drive the device at the next stage.

Reference is now made to FIG. 6a, which is a graph of the $+I_{drive}$, respectively $-I_{drive}$ with respect to the input voltage. It can be seen that the curve representing $I_{drive}$ with respect to the input voltage is linear over the whole range. In the present embodiment, the input voltage could go all the way up to 20 Volts or more and still conserve the linearity of the current intensity versus voltage function. At 20 Volts, for instance, with the values given in the circuit of the present embodiment, the amplitude of the current is 200 milliamperes. This amplitude is about 1000 times greater than the amplitude obtained in the linear range of the differential pair. It can also be shown that if the voltage input changes rapidly between a positive and a negative value, the buffer follows the input from the positive region to the negative region. A device of the present invention therefore responds instantly to a rapid change in the input voltage. The change of amplitude in the drive current is in phase with the change of input voltage. Such rapid changes of amplitude of the input voltage happens regularly in the reproduction of sounds from musical instruments as well as many servo positioning and robotic control applications. It should be noted that no storage delay phenomenon is observed and there is no saturation region.

Figure 1:
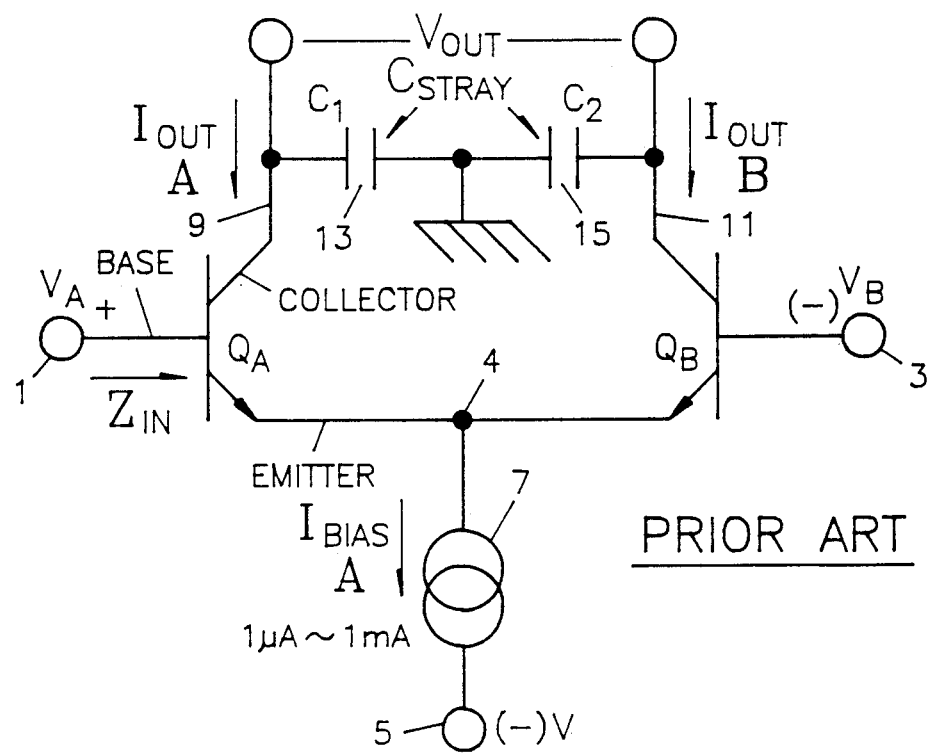
FIG. 1 is a schematic illustration of a circuit diagram of a differential pair, Prior Art.
Figure 2A:
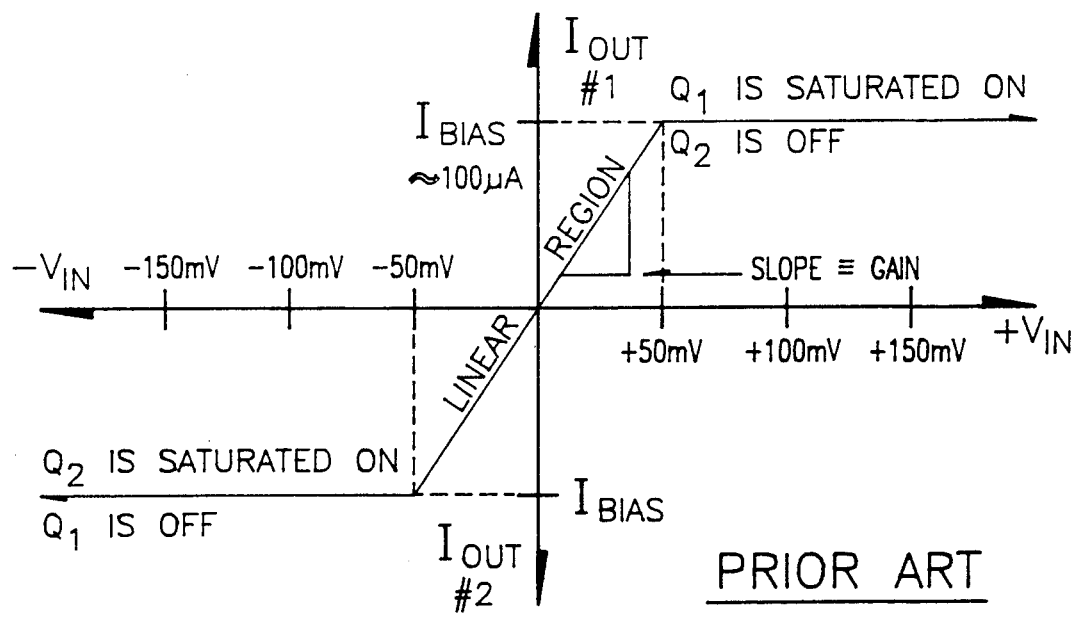
FIG. 2a is a graph illustrating the transfer Function, I. (current intensity) as a function of the input voltage, V. for the differential pair, Prior Art.
Figure 2B:
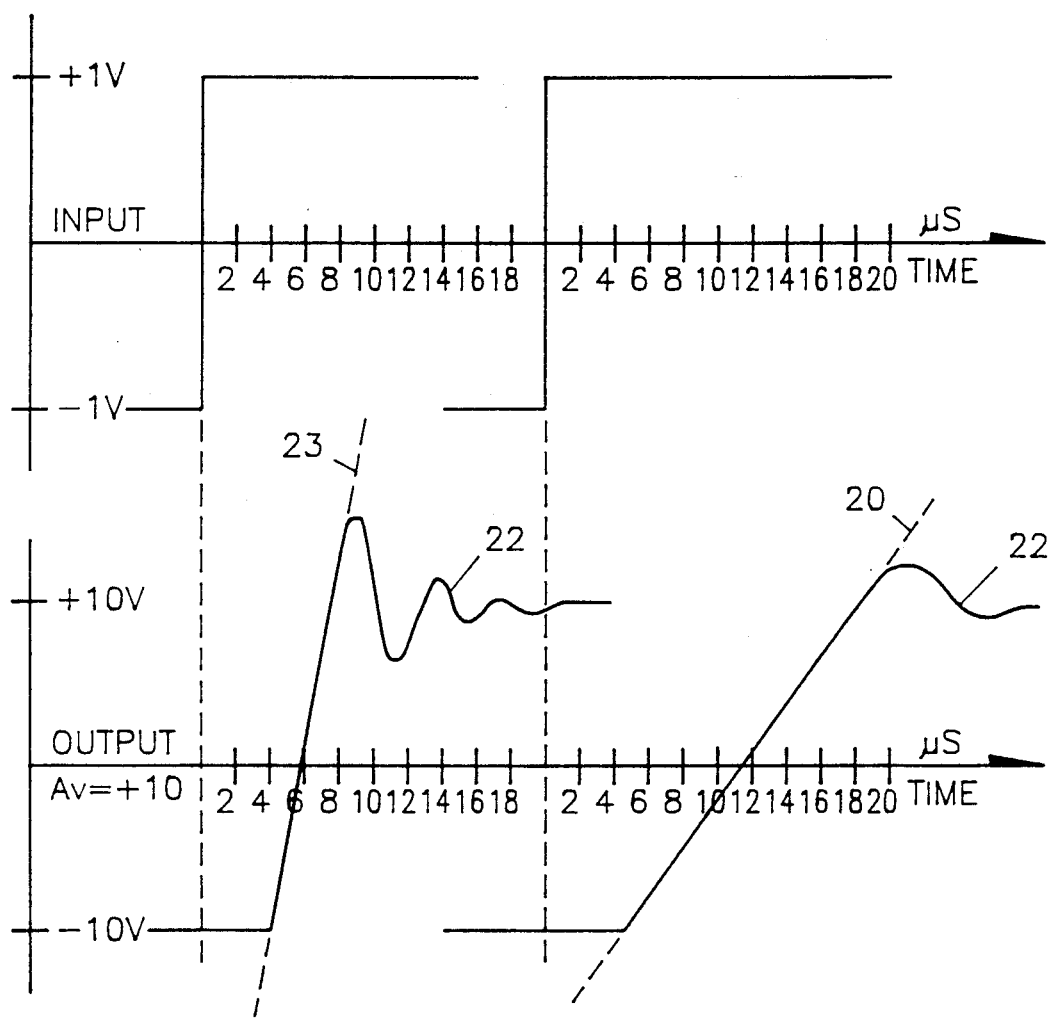
FIG. 2b illustrates how high speed step signals are typically output by amplifiers comprising of a differential pair, Prior Art.
Figure 3A:
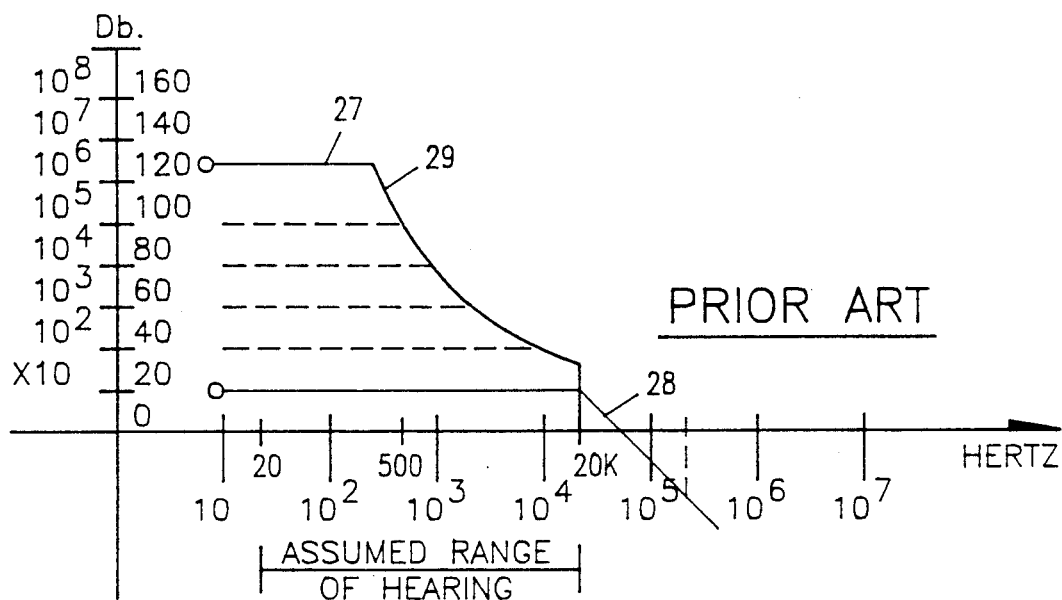
FIG. 3a is a graph illustrating how slew rate affects the power output of amplified acoustic signals with respect to frequency for the prior art.
Figure 3B:
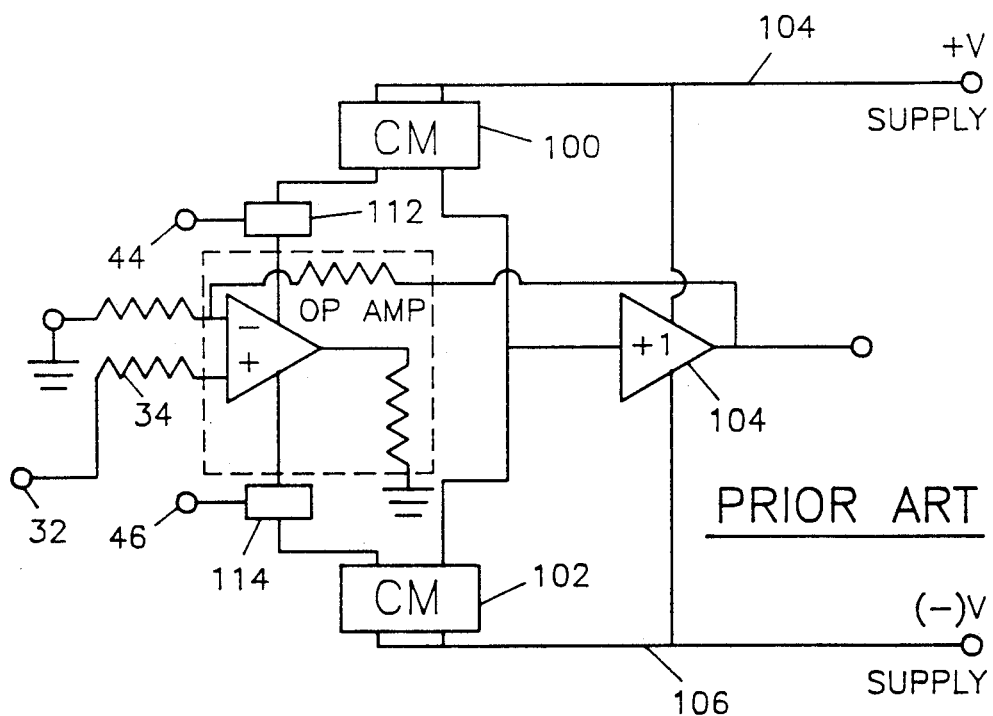
FIG. 3b illustrates how typical operational amplifiers are used in prior art.
Figure 6B:
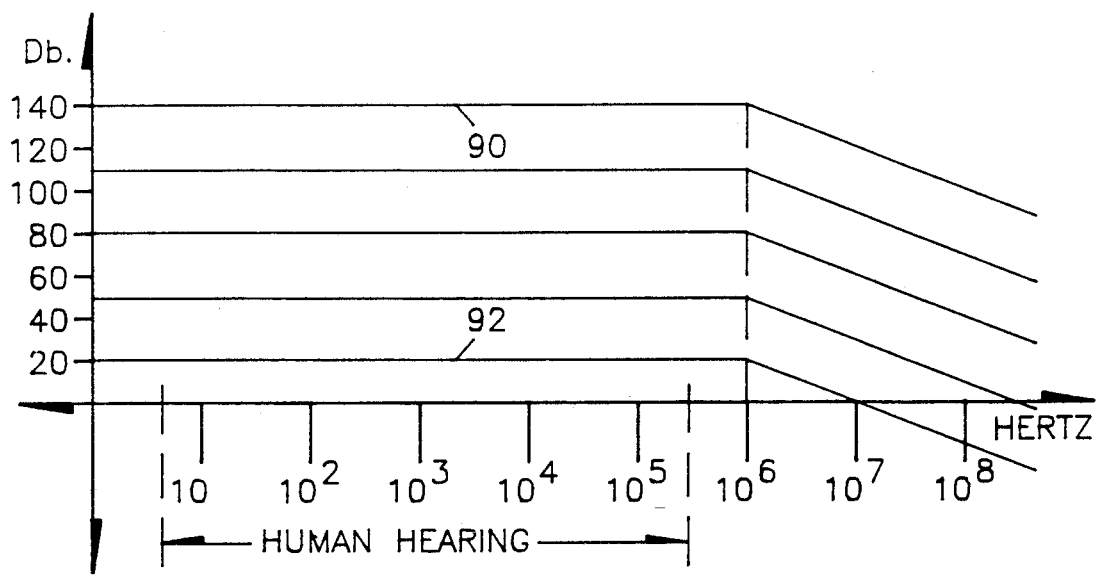
FIG. 6b shows the characteristic frequency response over a wide, dynamic input range according to the present invention.

Reference is now made to FIG. 6b which shows the characteristic frequency response over a wide dynamic input range. FIG. 6b is to be compared to FIG. 3a illustrating the frequency response for typical amplifiers using differential pairs. As shown in FIG. 6b, the amplifier of the present invention can accurately track any input signal frequency up to its bandwidth, and then continues to follow frequencies beyond its bandwidth, rolling off in amplitude at a gradual 6 dB/octave (first order). This natural characteristic allows the amplifier of the present invention to make transitions in the order of a few megahertz that are only 10 to 30 dB below normal bandwidth amplitudes without disrupting the particular phasing of these transitions. In FIG. 6b, the coordinates are again respectively the frequency in abscissa and the power of the acoustic signal in decibels in ordinate. The large signals are adequately covered up to 500 kHz and are designated by the numeral 90. Neither the large signal bandwidth 90 nor the small signal bandwidth, designated by the numeral 92, show a slew rate. High frequencies as well as low frequencies for large signals are now adequately covered up to approximately 500 kHz rather than as low as 500 Hz as mentioned in the case of amplifiers comprising differential pairs. It is also noteworthy that the roll-off at high frequencies is now a first order roll-off which has the least phase shift possible and requires no compensation.

Figure 4B:
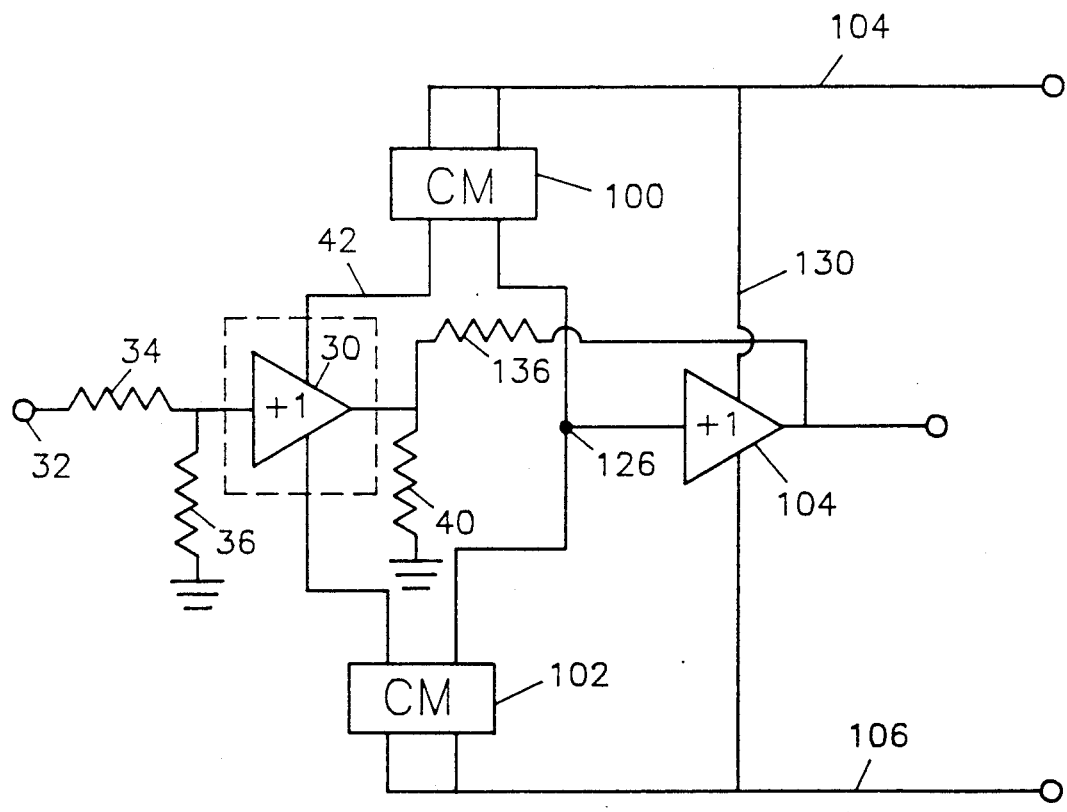
FIG. 4b illustrates the basic amplifier showing the displacement of the operational amplifier in FIG. 3b.
Figure 4C:
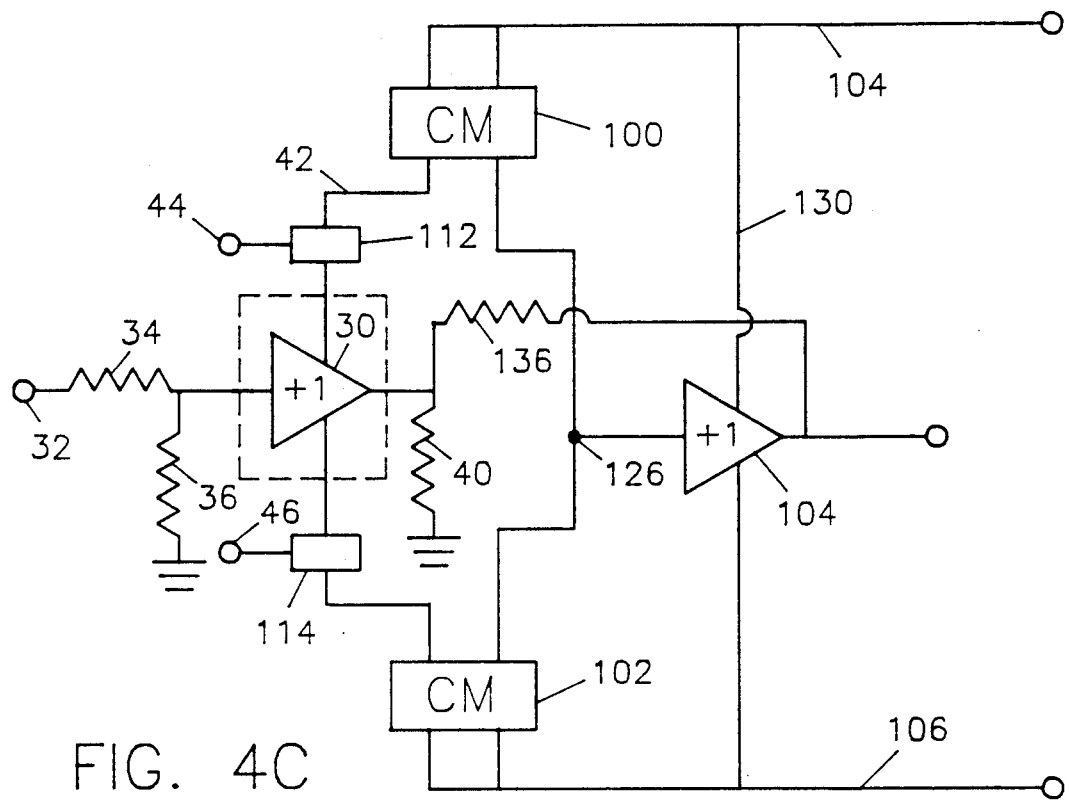
FIG. 4c illustrates a circuit for medium to high voltage output signals, wherein an additional; pair of regulated voltage supply rails are included for the protection of the first input buffer.
Figure 4D:
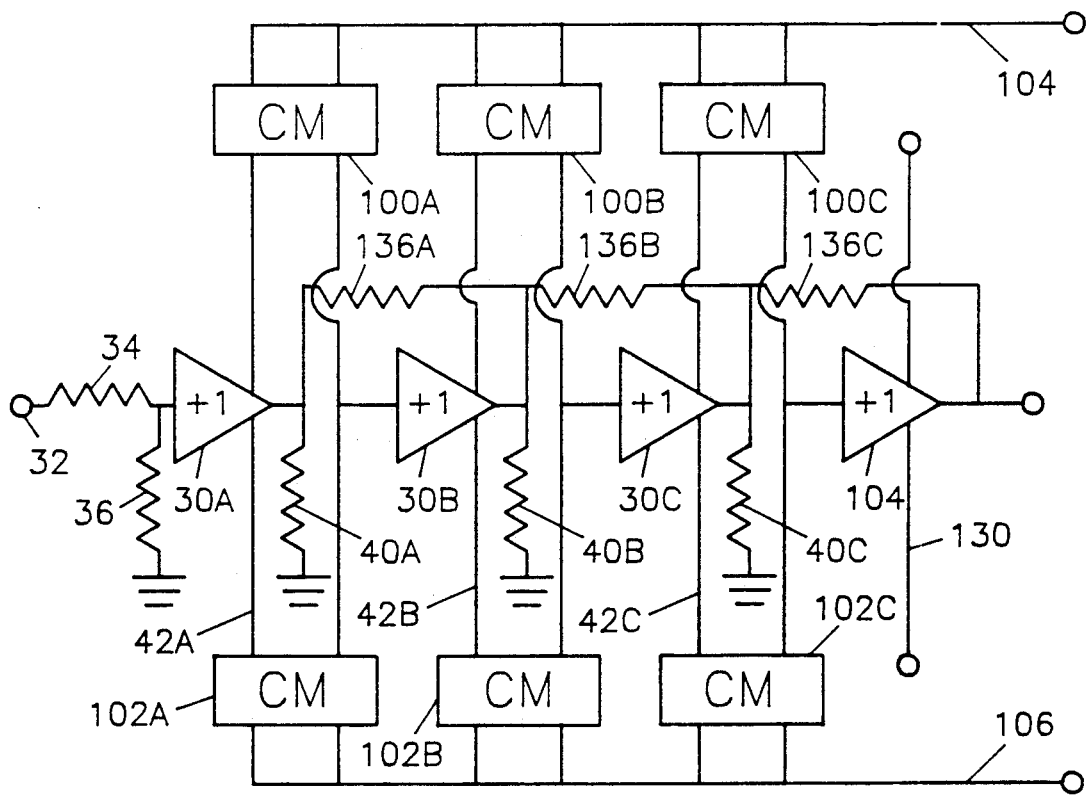
FIG. 4d illustrates a serially cascaded, chain-like version of the present invention for producing extremely high gains.
Figure 7:
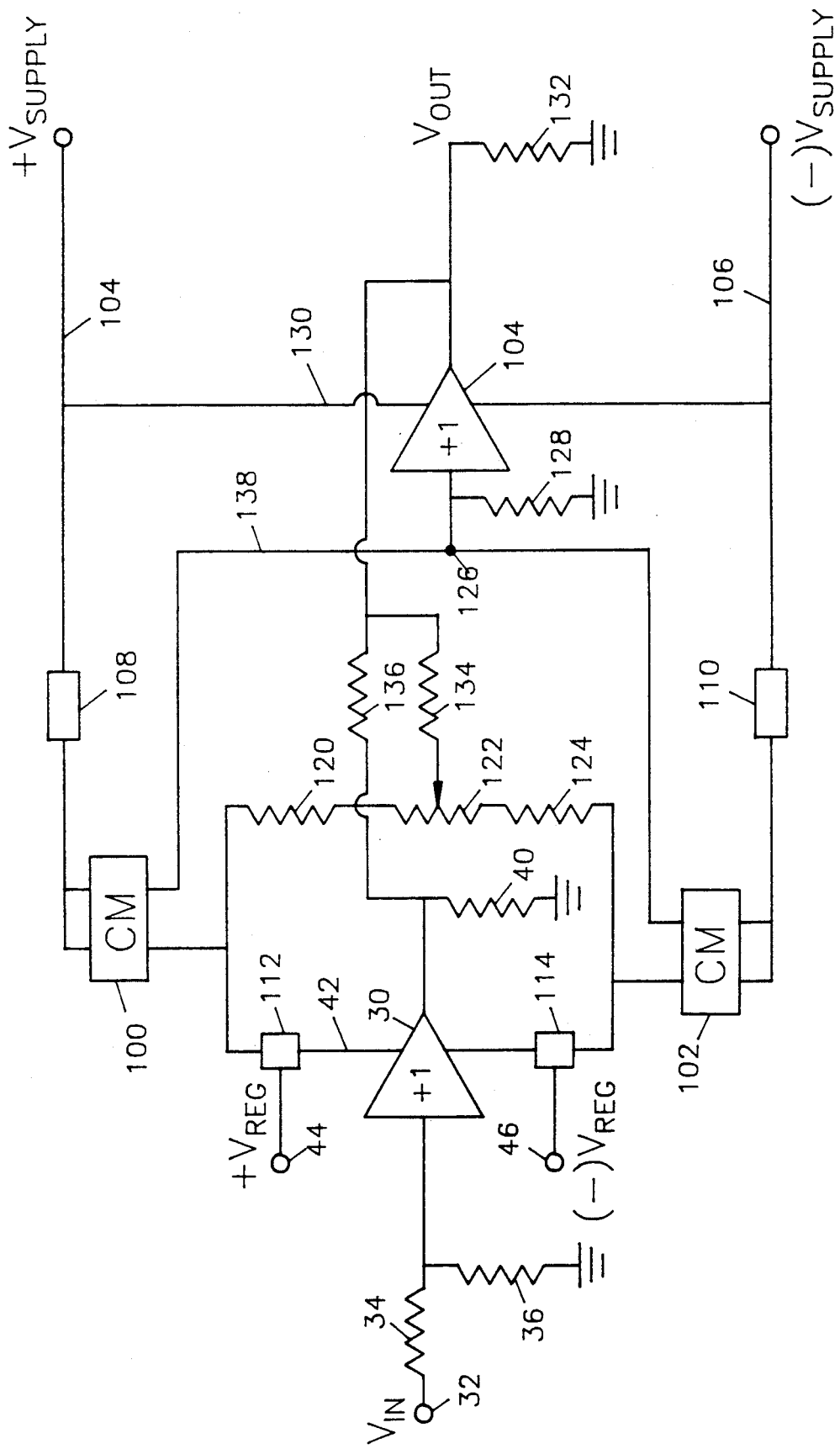
FIG. 7 is a circuit of a preferred embodiment of the present invention incorporating one or more of the stages described in FIGS. 4a–4c.

Reference is now made to FIG. 7, which is a circuit of a preferred embodiment of the present invention incorporating one or more of the stages described in FIGS. 4a–4c. An amplifier as illustrated in FIG. 7 comprises an input transconductance stage, a voltage gain stage and a current gain output stage. The amplifier of FIG. 7 typically comprises a first buffer 30 as illustrated in FIG. 4a, current mirrors 100 and 102 and, in an output stage, a second buffer 104 of voltage gain less or equal to 1, and substantially identical to the buffer 30 unless it is a power amplifier.

The circuit represented in FIG. 7 is driven by a first pair of voltage supply rails 104 and 106, preferably at or above 50 Volts. The voltage in these voltage supply rails is typically regulated by two voltage regulators 108 and 110. The voltage regulators 108 and 110 are respectively connected to the pair of opposing current mirrors 100 and 102. These current mirrors 108 and 110 operate in a known fashion and reflect the current back and forth between the input stage and the output stage. The positive current mirror 100 is connected to another voltage regulator 112. This is also the case for the negative current mirror 102 that is connected to a voltage regulator 114. The voltage regulators 112 and 114 supply the first buffer 30 with bias and drive current on current rail 42.

The current mirrors 100 and 102 typically each comprise a transistor 118 and a diode 116. The diodes 116 of the negative and of the positive current mirrors 100 and 102 are connected by a series of resistors 120, 122 and 124 adding to the bias current of the mirrors and providing a feedback input to the mirrors. The transistors 118 of the current mirrors 100 and 102 are also connected to a common node 126. The output of the first buffer 30 is loaded into a load resistor 40 as shown above in FIGS. 4a–4c. From the node 126, there is a connection to the input of the second buffer 104. Preferably, a resistor 128, typically of about 100 kiloohms is grounded on this connection. The voltage supply rails 104 and 106 further supply a bias current for the second buffer 104 via current rail 130. Furthermore, the output buffer 104 comprises two outputs. One output is loaded into the final load resistor 132 as for the first buffer 30. The second output is a feedback output and is connected back to the resistors 120, 122 and 124 linking the two diodes 118 of the current mirrors 100 and 102. Another branch from the voltage feedback output is connected to the output of the first buffer 30 via a resistor 136.

The voltage supply rail of this amplifier actually comprises two types of voltage supply. A first voltage supply 44, 46 drives regulators 112, 114 and supplies the bias rail 42 for the first buffer. This voltage supply is typically between 15 and 24 Volts, and preferably about 18 Volts. The second voltage supply 104, 106 is at a higher voltage, typically about 50 Volts. The reference voltage supply 44 and 46 controls the voltage of the regulators 112, 114 at a predetermined level. The other voltage regulators 108, 110, for the higher voltage supply 104, 106, control the high voltage at a second predetermined level. These different voltage values are only due to the fact that the integrated circuit chip chosen for the embodiment of the present invention could not hold the voltages higher than the voltages described hereinabove. It will be clear to the person skilled in the art that other values are also applicable. The voltage regulators 112 and 114 for the smaller voltage supply therefore hold the voltage at this first predetermined level. The current, however, can pass through all these voltage regulators unaffected.

The operation of the circuit of FIG. 7 will now be described in connection with a particular value that will facilitate the comprehension of the circuit. However, it should be understood that these values are only exemplary and do not restrict the scope of the present invention to a set of predetermined values. The input test voltage therefore is assumed to be at about +1 Volt. The voltage output of the first buffer is also plus 1 Volt. Because the load resistor 40 of the output of the first buffer 30 is about 100 ohms, the current value at the output of the buffer 30 is about 10 milliamperes. The current created at the output of the buffer pulls the drive current down through the bias rail 42. The value of the drive current $I_{drive}$ thus becomes 10 milliamperes. The value of this 10 milliamperes through the diode 116 of the current mirror 100 (for a positive value of the current) gives a logarithmic voltage increase across the diode 116. When a current is drawn through a diode, the voltage is increased logarithmically. When the diode 116 is matched with the transistor 118 of the current mirror 100 (the base-emitter junction), the transistor 118 transfers 10 milliamperes down the rail 138 coming from the transistor 118. This is a typical function of a current mirror. If a particular current is pulled through the diode 116, the current of the exact value is pushed down from the transistor 118 to the node 126. This is in addition to the bias current already circulating through the diode 116 and the transistor 118. This is due to the fact that the logarithmic change on the diode is processed within an exponential device, namely the transistor. The output current is therefore linear to the input current. The configuration, therefore, allows the two opposing current sources 100 and 102 to fight one another. Both have output impedances of the order of 100 kiloohms, and possibly 1 megohm. If an extra 10 milliampere of current is driven through the rail 138 comprising the node 126, the input voltage at the second buffer 104 is increased about 1,000 times. The output buffer 104 follows the increase in voltage. This output buffer 104 is driven by another rail 130 between the voltage supply rails 104 and 106 at 50 Volts or more for power amplifiers. If the output voltage of the second buffer 104 is at 50 Volts for an overall closed loop gain of 50, the voltage feedback branch brings back an additional 10 milliamperes of current through the resistor 136. Because the feedback branch is connected back to the output of the first buffer 30, the 10 milliamperes produced by the second buffer 104 is now replacing the initial current of 10 milliamperes originally created by the input voltage source of +1 Volt. This current from the buffer, therefore, is reduced because the 10 milliampere current is now being supplied by the output. The $I_{drive}$ current is therefore back to the original bias value of $I_{bias}$. The operating cycle for a step change output is now finished and a stable, feedback null is achieved without slew rate or ringing.

It is clear now that if the voltage input is negative, the $I_{drive}$ will circulate in opposite directions. In this case, the negative current mirror 102 takes the role previously described for the positive current mirror 100. If there is a positive input voltage, the positive current mirror adds the additional current to the bias current in the first rail 42. In this case, the negative current mirror remains at the same value. This is also the case if the input voltage is negative. In this case, the negative current mirror reflects back the current created by the input voltage across resistor 40. However, the positive current mirror remains at the same level. The fact that these two sources of current fight one another on the two rails 42 and 138 provides a very high voltage gain.

It can therefore be inferred that the stage represented by the current mirrors 100 and 102 and the output of the first buffer 30 correspond to an open loop gain in the voltage. The buffer 104 takes the high output impedance of this voltage gain and turns it into a low output impedance to match the load.

The diagram of FIG. 7 thus clearly illustrates the three aforementioned stages. The first stage or input transconductance stage, corresponds to a transfer of a change of input voltage into a change in current. The load resistor 40 sets the transconductance slope in this transconductance stage. The second stage is a voltage gain stage whereas the third stage is a current gain stage, again providing transconductance.

Although the preferred embodiment comprises a feedback branch, feedback is actually not necessary to get linearity in the output stage. The whole circuit is linear without feedback as every single stage is linear over a very wide input signal range.

Reference is now made more particularly to the current mirrors 100 and 102 and their mode of operation. One skilled in the art would recognize there are many variations of current mirrors, and all are appropriate for the present invention. A current mirror typically comprises an input diode and an output transistor. In most cases, the junction of the diode and the junction of the transistor are matched below one percent, which is necessary for good operation. As more current is pulled through the diode, the voltage drop across the diode increases logarithmically. The diode is also connected to the base of the output transistor. The function of the transistor which is inherently an exponential device, is to transform a logarithmic voltage change at the base with exponential gain into a linear current output. As more current is drawn through the input diode, the voltage increases ever so slightly. As the voltage increases, it turns on the transistor at the same rate. Because the input is logarithmic, the output of the exponential transistor is linear. Therefore, the $I_{drive}$ current is reflected by the current mirror on the bias rail to the output node 126.

When there is no net difference current flowing in the bias rail 42 of the first buffer 30, the two current mirrors 100 and 102 are matched against one another. Therefore, the current in the rail 138 flowing between the positive current mirror 100 and the negative current mirror 102 is quiescent. When the two current mirror sources 100 and 102 are at the same current, the node 126 is maintained at a still level or potential. This level could be +5 Volts, −10 Volts, etc. However, it is not necessarily at zero volts. There is no net change in voltage of the node 126 between the two current mirror sources 100 and 102. When there is a net difference in current between the output of the current mirrors 100 and 102, that net difference gives a net voltage force or acceleration causing a change in voltage at the node 126. This change of voltage continues until the balance between the two sources is reestablished. The balance is restored by the feedback resistor 136 supplying the same offset current that was originally supplied by the input voltage. There is no more net difference in the current rails of the input buffer 30. As soon as the current comes up from the feedback branch, the current in the bias rail 42 gets closed off and the balance is achieved again.

It should be noticed that the load resistor 40 at the output of the first buffer determines the slope of the transfer function. If the load resistor 40 at the output of the input buffer 30 is too low in value, the velocity is too great and may cause a single overshoot. In the preferred embodiment of the present invention, a load resistance of 500 ohms was found to be highly adequate for the current mirrors used in the present invention. It should, however, be understood that this value can change depending upon the characteristics of the current mirrors and both buffers. A value of 100 ohms has also been found adequate. If, however, the current mirrors and first buffer are of excellent quality as well as the second buffer 104, the load resistor could be higher than be 1000 ohms. Practically, the value of the $R_{load}$ is chosen to obtain the correct value for the smoothest balancing of the current mirrors selected. If $R_{load}$ is too high, the response may be too slow (low open loop gain). Once $R_{load}$ has been selected, the values of the other resistors are selected so as to obtain the preselected gain. The gain may therefore vary on a 1 to 10 range, whereas the frequency may vary on a 1 to 2 range. The gain can therefore be changed on a wide range without changing the overall frequency response. In the present invention, once a frequency response has been settled upon by selecting $R_{load}$, the gain can be varied independently of this frequency response. This is different from operational amplifier for which there is a 1 to 1 inverse correspondence between the frequency response and the gain.

In an alternate embodiment, a bias device can be used in the first buffer 30 and the second buffer 104 so as to prevent any cross-over distortion. This bias device is for the two output stages.

As mentioned above, the feedback branch from the second buffer 104 can be placed at the output of the first buffer 30 or at its input depending on whether the buffer inverts or not. The feedback can also be returned to the current mirrors 100 and 102 instead of the load resistor 40.

Although the preferred embodiment of the present invention has been described in connection with an output stage formed by an output buffer, the present invention should not be limited to such a configuration. In particular, the input stage comprised of the first buffer and opposing current mirrors can be connected to another similar input stage or several input stages. In this particular embodiment, the input stages are cascaded back to back without using an output buffer between stages.

The principal advantage of the circuits in accordance with this present invention is the increased range of open loop gain and closed loop linearity thus obtained. The amplifier of the present invention can therefore accept very high inputs and yet remain linear. It can also take overdrive signals as is often the case in audio-signals for a number of musical instruments as well as many servo-robotic control applications.

The amplifier of the present invention also has excellent high frequency roll-off characteristics. The roll-off is of the first order, typically between 100 khz and 5 MHz. When used with input audio-signals, the second buffer is connected to a sound reproducing transducer. In such a use, the amplifier of the present invention has excellent sonic performances. The open loop gain is set by the load resistor 40. The closed loop stability is set once by proper selection of this load resistor. There is no need for trimming in production runs. Furthermore, no capacitors or compensation are needed. The overall bandwidth is set by the closed loop gain, the value of the load resistor and by the bias current circulating in the current mirrors. Extreme load conditions only reduce the bandwidth but not stability, and never more than an octave with good designs which is important in many servo and robotic applications. The amplifier of the present invention is unconditionally stable and does not oscillate under any load or input overdrive conditions provided there is enough bypass capacitance. The amplifier actually damps all load variations at all frequencies inside its bandwidth.

As mentioned hereinabove, each stage of the amplifying circuit is linear over a large driving range. Contrary to differential pairs, no slew rate phenomenon can be observed. Larger load variations simply produce larger damping (to the limits of the output stage).

Finally, the amplifier of the present invention has no slew rate. This means that the greater the input overdrive is, the faster the output climbs. This has redeeming qualities in both audio amplifier and servo/robotics applications. In the audio field, the crescendo of numerous instruments may require extreme rise and fall times in the first instant of the clash. Any amplifier with a slew rate, no matter how fast, erases part of these signals during the slew rate.

Figure 8:
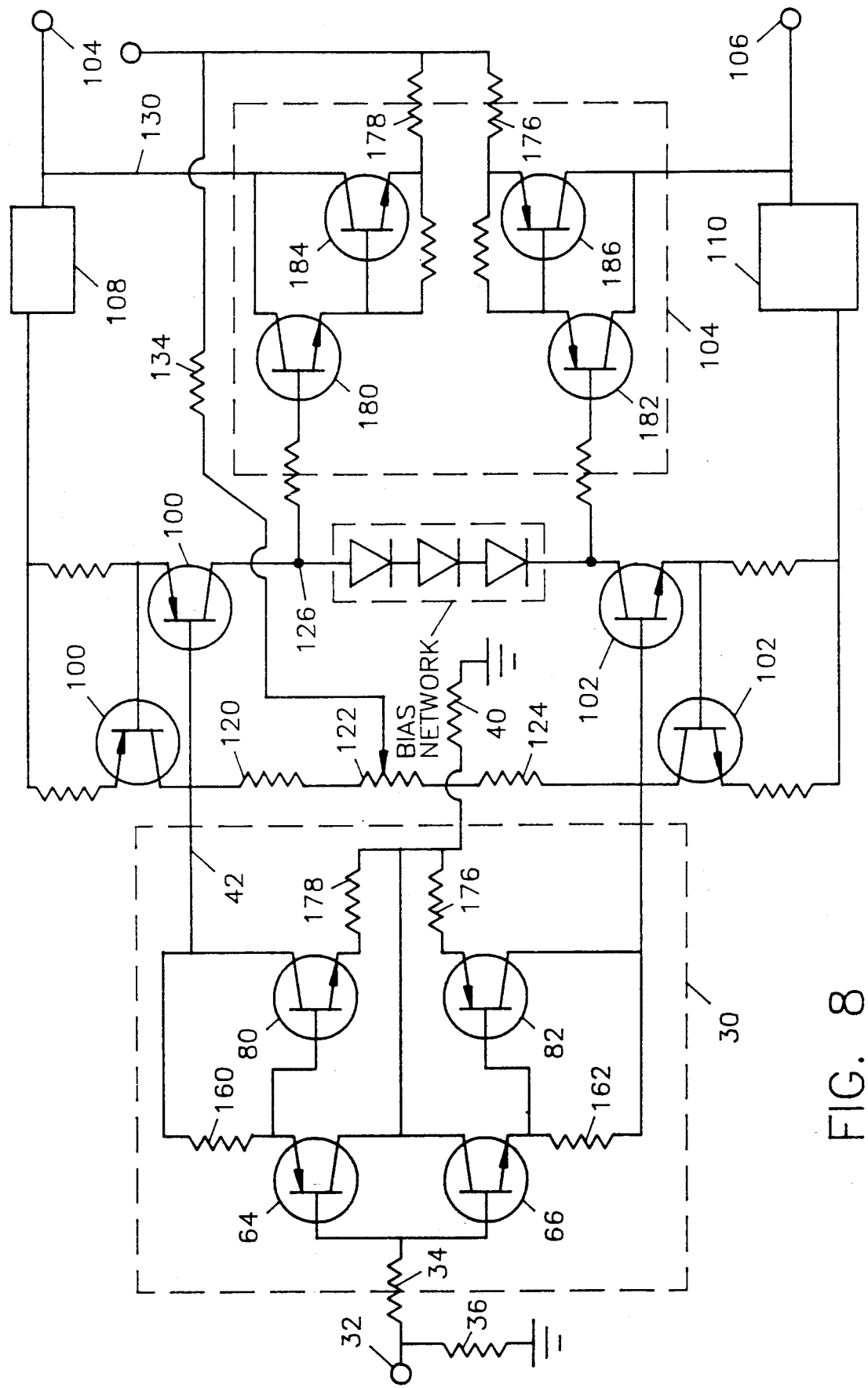
FIG. 8 illustrate an alternative embodiment of the present invention.

An alternative embodiment of the present invention is shown in FIG. 8. The numerals in FIG. 8 designate the same elements shown in FIG. 7.

Figure 4E:
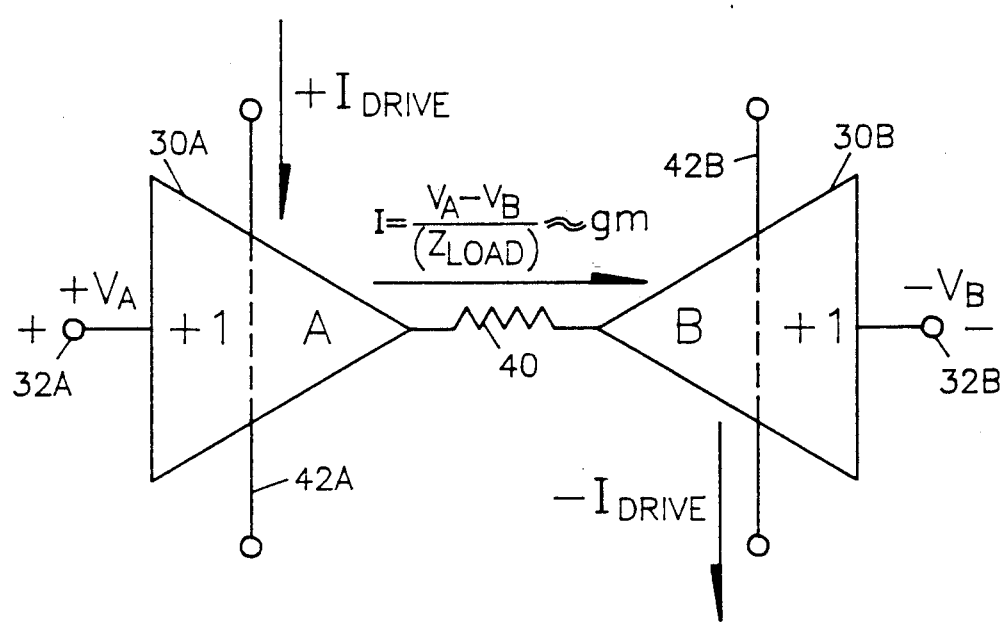
FIG. 4e illustrates a Differential Buffer Block of the present invention.
Figure 4F:
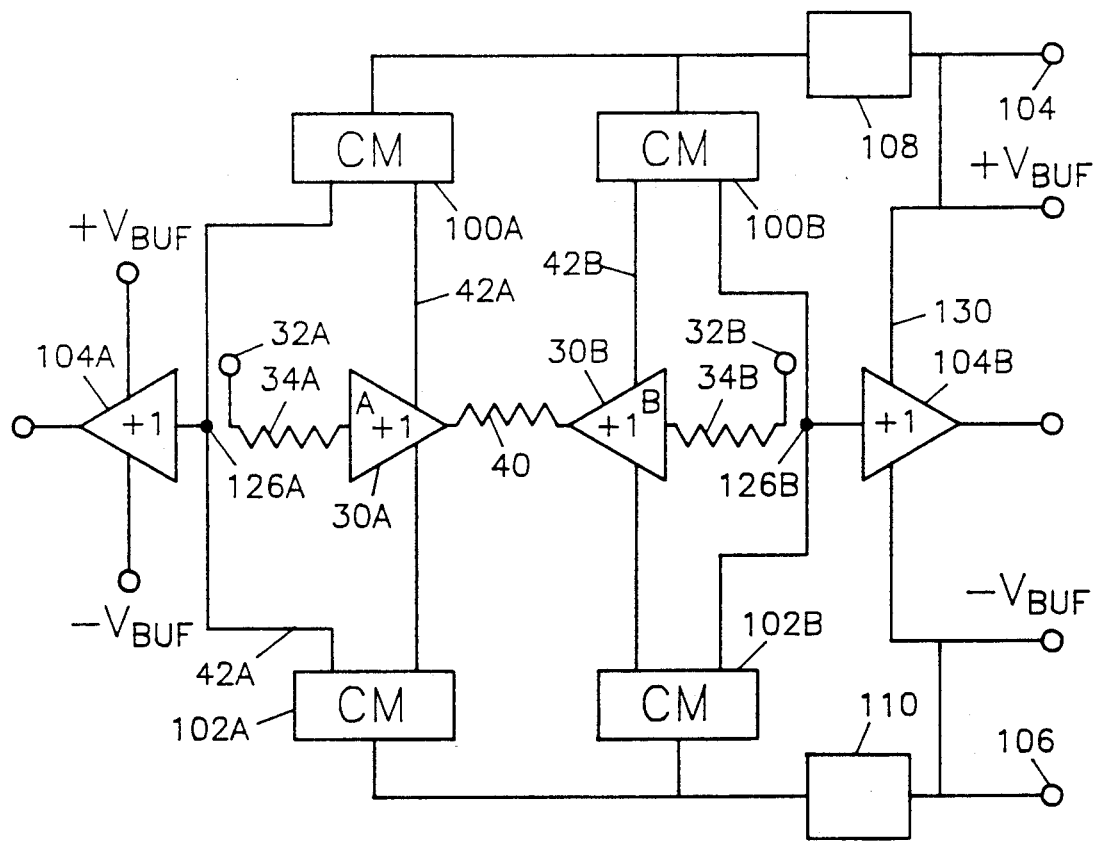
FIG. 4f illustrates the use of a Differential Buffer Block to produce complimentary differential outputs.

FIGS. 4e and 4f illustrate a block diagram of the differential buffer block of the present invention. The like numerals designate the like elements as in FIGS. 7, 8. It is the nearest equivalent to the differential pair without a saturation region or slew rate. In the differential buffer block shown in FIG. 4e, the buffer A is attached to the rest of the stages; current mirrors, outputs and feedback. The buffer B may or may not be attached to its own stages; current mirrors, and output for a complementary output to A. If one assumes that a signal of 1 volt is supplied to the input 32 of buffer A, as shown in FIG. 4f, while buffer B is 0 volts, then a current, differential in nature, will traverse the resistor 40 from buffer A to buffer B. This current is equal for both buffers A and B, and will affect the following stages of both buffers A and B in equal but opposite directions. This current is proportional to the voltage drop across the resistor 40 (or the difference between buffer A input and buffer B input divided by the value of the load resistor 40.

If one assumes that a +1 volt signal is applied at the input 32 of buffer B, while buffer A remains at +1 volt, here is no set voltage drop across the resistor 40 and no resulting current. Both final output currents of buffers A and B will be zero again.

In the event that a +2 volt signal is applied at the input 32 of buffer B, while buffer A remains at +1 volt, there is a differential current proportional to the voltage 1 volt divided by the value of the resistor 40. This current now flows from buffer B to buffer A—opposite from the first situation, but still differential in nature.

This differential buffer block permits one to take the difference between two inputs with great accuracy at high frequencies—based on the matching and offsets of buffers A and B. Also, both inputs have high input impedance which is important in low level audio or servo/robotic measurement applications. This allows the common mode rejection bandwidth to equal the large signal bandwidth in the present invention. There is also a specific need in audio for this configuration in the construction of precision active cross-over networks. In the differential buffer block, any reference to the feedback elements and paths has been left out as, at this point, with two inputs and two outputs with gain, the possible number of combinations of feedback paths is a very large number—at least as big as the number of feedback combinations applied to the prior art OP AMP with its differential pair. A person skilled in the art will recognize that any number of configurations is possible, and it would be a mere routine task to select the proper feedback path configuration for the desired results using the differential buffer block of the present invention.

Figure 9:
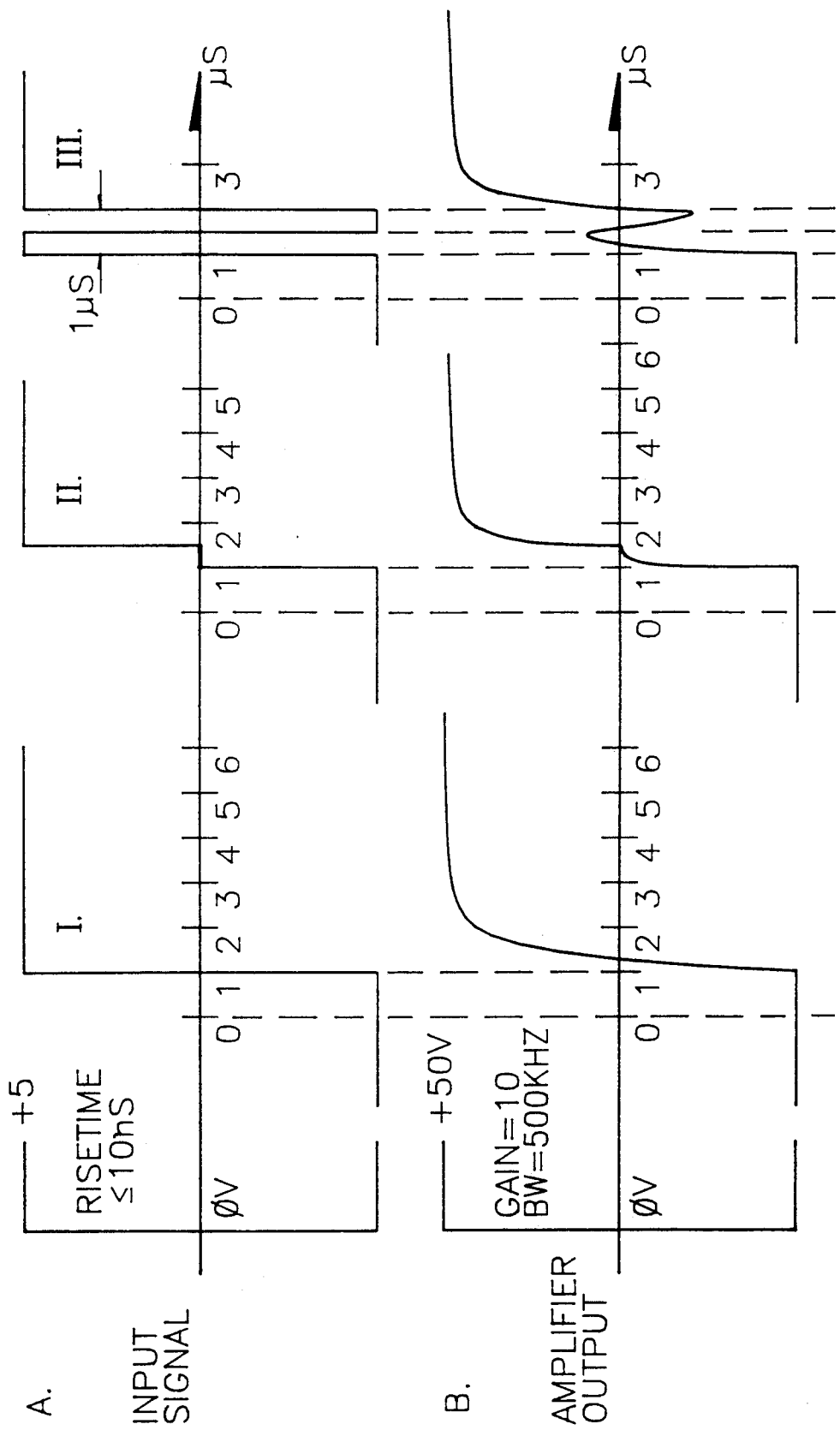
FIG. 9 shows three types of input dynamic step changes, used in evaluating the high frequency performance of the amplifier of the present invention, and the characteristic outputs of the present invention.

Reference is now made to FIG. 9 which shows three types of dynamic "step changes" which are useful in evaluating the high frequency performance of the amplifiers of the present invention. These three signals are designated by the roman numerals I, II and III. The input signals are square waves having a rise time of the order of 10 ns and of peak voltage 5 V. The output signals produced by the amplifier of the present invention vary between $-50$ Volts and $+50$ Volts (gain 10, bandwidth 500 khz) and are represented in the lower part of FIG. 9. FIG. 9 shows the ability of the amplifier of the present invention to track large signal transients. Notice that the storage delay is almost nonexistent. It should also be noted that the amplifier in accordance with the present invention can follow signal information embedded in the step change which is beyond the amplifier's bandwidth. In the output signal I, no slew rate, overshoot, or ringing can be observed. The rise time of the output signal is caused by the single RC time constant of the current mirrors inside the amplifier. It is thus of a first order nature. The fundamental representation of the higher harmonics of the output step signals II and III are faithfully represented and in phase with the input signals. There is little loss of the information on the rising edge, no T.I.M. distortion, and no overshoots as in amplifiers comprising differential pairs.

The audio and servo/robotics amplifiers of the present invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come within the meaning and range of equivalency of the claims are to be embraced with their scope.

What is claimed and desired to be secured by U.S. Letters Patent is:

1. An electrical circuit for amplifying complex or high speed signals, constructed with solid state devices, comprising: a first input buffer, having a single, non-inverting input of high impedance, an open loop voltage gain not exceeding unity, and a low impedance output;

a first current rail traversing through said first input buffer for supplying currents to said first buffer's low impedance output;

a pair of opposing current mirrors whose inputs are connected to said first current rail of said first input buffer and whose outputs are combined together;

a load resistor connected to output of said first input buffer, the combination of said first buffer, said opposing current mirrors and said load resistor forming a first input stage;

a second output buffer having a single non-inverting input of high impedance which is connected to the output of the opposing current mirrors, an open loop voltage gain not exceeding unity, and a low impedance output;

a second current rail traversing through said second output buffer for supplying currents to said second buffers low impedance output;

dual voltage supply rails for driving said opposing current mirrors, subsequent first input buffer and said second output buffer; and, a feedback means is connected from the said second buffer output to the load resistor of said input buffer.

2. An electrical circuit as defined in claim 1 with wherein a feedback network means is connected from a final output to the inputs of said opposing current mirrors.

3. An electrical circuit as defined in claim 1 with bias means to minimize or eliminate common crossover distortion.

4. An electrcial circuit as defined in claim 1 for use at different power levels wherein said amplifier circuits are designed and used for very low power signals, low and medium power signals, as well as high and very high power signals of complex, wideband wave shapes.

5. An electrical circuit as defined in claim 1 wherein said amplifier circuits are designed and used for audio signals, at any or all appropriate power levels used therein.

6. An electrical circuit as defined in claim 1 wherein said amplifier circuits are designed and used for servo control loop signals, at any or all appropriate power levels used therein.

7. An electrical circuit as defined in claim 1 wherein said amplifier circuits are designed and used for robotic control loop signals at any or all appropriate power levels used therein.

8. An electrical circuit with very high gain for amplifying complex or high speed signals constructed with solid state devices, comprising:

a first input buffer, having a single, non-inverting input of high impedance, an open loop voltage gain not exceeding unity, and a low impedance output;

a first current rail traversing through said first input buffer for supplying currents to said first buffer's low impedance output;

a pair of opposing current mirrors whose inputs are connected to said first current rail of said first input buffer and whose outputs are combined together;

a load resistor connected to output of said first input buffer, the combination of said first buffer, said opposing current mirrors and said load resistor forming a first input stage;

a second input stage, similar in form and function to said first input stage, wherein the input of said second input stage is connected to the combined outputs of the opposing current mirrors of said first input stage;

a third output buffer having a single, non-inverting input and a low impedance output and transversing current rail is attached to the combined current mirror outputs of said second input stage;

dual voltage supply rails for driving said first and second input stages and said third output buffer; and feedback means connecting a final output to the load resistors of at least one of said first and second input stages.

9. An electrical circuit as defined in claim 8, wherein a feedback network means is connected from a final output to at least one pair of inputs of said opposing current mirrors.

10. An electrical circuit as defined in claim 8 with bias means to minimize or eliminate common crossover distortion.

11. An electrical circuit as defined in claim 8 for use at different power levels wherein said amplifier circuits are designed and used for very low power signals, low and medium power signals, as well as high and very high power signals of complex, wideband wave shapes.

12. An electrical circuit as defined in claim 8 wherein said amplifier circuits are designed and used for audio signals, at any or all appropriate power levels used therein.

13. An electrical circuit as defined in claim 8 wherein said amplifier circuits are designed and used for servo control loop signals, at any or all appropriate power levels used therein.

14. An electrical circuit as defined in claim 8 wherein said amplifier circuits are designed and used for robotic control loop signals at any or all appropriate power levels used therein.

15. A method of amplifying complex waveforms as high speed audio, servo, or robotic control signals from very low to medium power levels used therein, without slew rate or the need for compensation, comprising the steps of:
  applying a voltage signal at the input of a first input buffer;
  applying a current rail through said first input buffer for supplying current to said input buffer's low impedance output;
  producing a varying current through a load resistor at the output of said first input buffer, in direct proportion to input voltage signal;
  changing the intensity of the bias current traversing said current rail through said first input buffer in direct proportion to input voltage signal;
  reflecting these changes of intesity in said current rail through a pair of opposing current mirrors, the combination of said first buffer, said load resistor and said current mirror forming a first input stage;
  inputting said change of intensity at the input of a second output buffer; and
  providing a feedback network means of passive components from the output of said second output buffer to the load resistor of said first input buffer.

16. A method of completely eliminating slew rate distortions and oscillations in complex wideband waveshapes at high power levels in audio signals, servo control loop signals, and robotic control loop signals, comprising the steps of:
  applying an input voltage signal at an input of a first input buffer;
  transforming said input voltage signal into a current signal at the low impedance output of said first input buffer through a load resistor;
  adding the changing intensity of said current signal into a bias current rail going through said first buffer;
  transferring the said current signal through a pair of regulated, dual voltage supply rails;
  reflecting said current signal through a pair of opposing current mirrors at regulated, dual, higher voltage supply rails;
  applying said current signal at an input of a second output buffer, said second output buffer being traversed by another current rail which supplies current to a low impedance load from a third pair of dual high voltage supply rails, and;
  applying feedback from the output of said second buffer to the load resistor of said first input buffer and the inputs of said opposing current mirrors.

17. An electrical circuit for amplifying complex, high speed power signals, having voltage regulation for the input stage, and constructed with solid state devices, comprising:
  a first input buffer, having a single, non-inverting input of high impedance, an open loop voltage gain not exceeding unity, and a low inpedance output;
  a first current rail traversing through said first input buffer for supplying currents to said first buffer's low inpedance output;
  a pair of opposing current mirrors whose inputs are connected to said first current rail of said first input buffer and whose outputs are combined together;
  a load resistor connected to output of said first input buffer, the combination of said first buffer, said opposing current mirrors and said load resistor forming a first input stage;
  a first set of dual, regulated, opposing voltage supply rails for supplying currents to said first input stage;
  a second output buffer having a single, non-inverting input of high impedance which is connected to the combined outputs of the said opposing current mirrors, an open loop voltage gain not exceeding unity, and a low impedance output;
  a second current rail traversing through said second output buffer for supplying current to said second buffer's low impedance output;
  a second, higher set of dual, opposing voltage supply rails for supplying currents to both said current rail of said output buffer and the inputs of the said first set of regulated voltage supply rails; and,
  a feedback means is connected from the said second buffer's output to the load resistor of said first input buffer.

18. An electrical circuit as defined in claim 17 with bias means to minimize or eliminate common crossover distortion.

19. An electrical circuit as defined in claim 17 for use at different power levels wherein said amplifier circuits are designed and used for very low power signals, low and medium power signals, as well as high and very high power signals of complex, wideband wave shapes.

20. An electrical circuit as defined in claim 17 wherein said amplifier circuits are designed and used for audio signals, at any or all appropriate power levels used therein.

21. An electrical circuit as defined in claim 17 wherein said amplifier circuits are designed and used for servo control loop signals, at any or all appropriate power levels used therein.

22. An electrical circuit as defined in claim 17 wherein said amplifier circuits are designed and used for robotic control loop signals at any or all appropriate power levels used therein.

23. An electrical circuit for amplifying complex, high speed, high voltage signals having voltage regulation for the input buffer and constructed with solid state devices, comprising:
  a first input buffer, having a single, non-inverting input of high impedance, an open loop voltage gain not exceeding unity, and a low impedance output;
  a first current rail traversing through said first input buffer for supplying currents to said first buffer's low impedance output;

a first set of dual, regulated, opposing voltage supply rails for supplying currents to said current rail of said first input buffer;

a pair of opposing current mirrors, whose inputs supply currents to the said first set of regulated voltage supply rails, and whose outputs are combined together;

a load resistor connected to output of said first input buffer, the combination of said first buffer, said first set of regulated voltage supply rails, said opposing current mirrors, and said load resistor forming a first input stage;

a second output buffer having a single, non-inverting input of high impedance which is connected to the combined outputs of the said opposing current mirrors, an open loop voltage gain not exceeding unity, and a low impedance output;

a second current rail traversing through said second output buffer for supplying currents to said second buffer's low impedance output;

a second set of dual, opposing high voltage supply rails for supplying currents to said first input stage, and said current rail of said output buffer; and, a feedback means is connected from the said second buffer's output to the load resistor of said first input buffer.

24. An electrical circuit as defined in claim 23 with bias means to minimize or eliminate common crossover distortion.

25. An electrical circuit as defined in claim 23 for use at different power levels wherein said amplifier circuits are designed and used for very low power signals, low and medium power signals, as well as high and very high power signals of complex, wideband wave shapes.

26. An electrical circuit as defined in claim 23 wherein said amplifier circuits are designed and used for audio signals, at any or all appropriate power levels used therein.

27. An electrical circuit as defined in claim 23 wherein said amplifier circuits are designed and used for servo control loop signals, at any or all appropriate power levels used therein.

28. An electrical circuit as defined in claim 23 wherein said amplifier circuits are designed and used for robotic control loop signals at any or all appropriate power levels used therein.

29. An electrical circuit for amplifying complex, high speed signals having extremely high gain and constructed with solid state devices, wherein a plurality of input stages are connected in a serial fashion or cascaded to form a continuous chain, comprising:

a first input buffer, having a single, non-inverting input of high impedance, an open loop voltage gain not exceeding unity, and a low impedance output;

a first current rail traversing through said first input buffer for supplying currents to said first buffer's low impedance output;

a pair of opposing current mirrors whose inputs are connected to said first current rail of said first input buffer and whose outputs are combined together;

a load resistor connected to output of said first input buffer, the combination of said first buffer, said opposing current mirrors and said load resistor forming a first input stage;

a plurality of input stages, similar in form and function to said first input stage, are connected in a serially cascaded fashion, buffer input to current mirror output, starting with the said first input stage and continuing until the last input stage;

a final output buffer having a single non-inverting input of high impedance which is connected to the combined outputs of the last set of opposing current mirrors, an open loop voltage gain not exceeding unity, and a low impedance output;

a current rail traversing through said final output buffer for supplying currents to said final buffer's low impedance output;

a set of dual, opposing voltage supply rails for supplying currents to all said input stages and said current rail of said output buffer; and, a feedback network means is connected from a final output to the load resistors of at least one of said input buffers and to at least one pair of the inputs of said opposing current mirrors.

30. An electrical circuit as defined in claim 29 with bias means to minimize or eliminate common crossover distortion.

31. An electrical circuit as defined in claim 29 for use at different power levels wherein said amplifier circuits are designed and used for very low power signals, low and medium power signals, as well as high and very high power signals of complex, wideband wave shapes.

32. An electrical circuit as defined in claim 29 wherein said amplifier circuits are designed and used for audio signals, at any or all appropriate power levels used therein.

33. An electrical circuit as defined in claim 29 wherein said amplifier circuits are designed and used for servo control loop signals, at any or all appropriate power levels used therein.

34. An electrical circuit as defined in claim 29 wherein said amplifier circuits are designed and used for robotic control loop signals at any or all appropriate power levels used therein.

35. An electrical circuit for amplifying the difference between complex, high speed signals having differential outputs and constructed with solid state devices, comprising:

a first and second input buffer, each having a single non-inverting high impedance input, an open loop voltage gain not exceeding unity, and a low impedance output;

a first current rail traversing through said first input buffer, a second current rail traversing through said second input buffer, each current rail for supplying currents to said respective first and second buffers' low impedance outputs;

a load resistor means is connected between the outputs of said first and second input buffers, the combination of said first input buffer, said second input buffer, and said load resistor forming a differential buffer block;

a first and second pair of opposing current mirrors each with combined outputs and whose inputs are connected to said first current rail of said first input buffer and to said second current rail of said second input buffer, respectively;

a first and second output buffer, each having a single, non-inverting high impedance input which are each connected respectively to the combined outputs of said first and second opposing current mirrors, each having open loop voltage gains not exceeding unity, and each having low impedance outputs;

a first current rail traversing through said first output buffer, a second current rail traversing through said second output buffer, each current rail for supplying currents to said respective first and second output buffers' low impedance outputs;

dual opposing voltage supply rails for driving both said opposing current mirrors, subsequent first and second input buffers and said first and second output buffers; and a feedback network means of passive components is connected from at least one output of said first and second output buffers to at least one end of the load resistor means.

36. An electrical circuit as defined in claim 35 with bias means to minimize or eliminate common crossover distortion.

37. An electrical circuit as defined in claim 35 for use at different power levels wherein said amplifier circuits are designed and used for very low power signals, low and medium power signals, as well as high and very high power signals of complex, wideband wave shapes.

38. An electrical circuit as defined in claim 35 wherein said amplifier circuits are designed and used for audio signals, at any or all appropriate power levels used therein.

39. An electrical circuit as defined in claim 35 wherein said amplifier circuits are designed and used for servo control loop signals, at any or all appropriate power levels used therein.

40. An electrical circuit as defined in claim 35 wherein said amplifier circuits are designed and used for robotic control loop signals at any or all appropriate power levels used therein.

41. An electrical circuit for amplifying the difference between complex, high speed signals having differential outputs, having voltage regulation for the gain stage, and constructed with solid state devices, comprising:

a first and second input buffer, each having a single non-inverting high impedance input, an open loop voltage gain not exceeding unity, and a low impedance output;

a first current rail traversing through said first input buffer, a second current rail traversing through said second input buffer, each current rail for supplying currents to said respective first and second input buffers' low impedance outputs;

a load resistor means is connected between the outputs of said first and second input buffers, the combination of said first input buffer, said second input buffer, and said load resistor forming a differential buffer block;

a first and second pair of opposing current mirrors with combined outputs and whose inputs are connected to said first current rail of said first input buffer and to said second current rail of said second input buffer, respectively;

a first set of dual, regulated, opposing voltage supply rails for supplying currents to said first and second opposing current mirrors and subsequent said differential buffer block;

a first and second output buffer, each having a single non-inverting high impedance input which is connected respectively each to the combined output of said first and second opposing current mirrors, each having an open loop voltage gain not exceeding unity, and each having a low impedance output;

a first current rail traversing through said first output buffer, a second current rail traversing through said second output buffer, each current rail for supplying currents to said first and second output buffers' low impedance outputs;

a second, higher set of dual, opposing voltage supply rails for supplying currents to both said current rails of said output buffers, and the inputs of the said first set of regulated voltage supply rails; and, a feedback network means of passive components is connected from at least one output of said first and second output buffers to at least one end of the load resistor means.

42. An electrical circuit as defined in claim 41 with with bias means to minimize or eliminate common crossover distortion.

43. An electrical circuit as defined in claim 41 for use at different power levels wherein said amplifier circuits are designed and used for very low power signals, low and medium power signals, as well as high and very high power signals of complex, wideband wave shapes.

44. An electrical circuit as defined in claim 41 wherein said amplifier circuits are designed and used for audio signals, at any or all appropriate power levels used therein.

45. An electrical circuit as defined in claim 41 wherein said amplifier circuits are designed and used for servo control loop signals, at any or all appropriate power levels used therein.

46. An electrical circuit as defined in claim 41 wherein said amplifier circuits are designed and used for robotic control loop signals at any or all appropriate power levels used therein.

47. An electrical circuit for amplifying complex, high speed, high power signals having voltage regulation for the input buffer and the input stage, and constructed with solid state devices, comprising:

a first input buffer, having a single, non-inverting input of high impedance, an open loop voltage gain not exceeding unity, and a low impedance output;

a first current rail traversing through said first input buffer for supplying currents to said first buffer's low impedance output;

a first set of dual, regulated, opposing voltage supply rails for supplying currents to said current rail of said first input buffer;

a pair of opposing current mirrors, whose inputs supply currents to the said first set of regulated voltage supply rails, and whose outputs are combined together;

a load resistor connected to output of said first input buffer, the combination of said first buffer, said first set of regulated voltage supply rails, said opposing current mirrors, and said load resistor forming a first input stage;

a second set of dual, regulated, opposing high voltage supply rails for supplying currents to said first input stage;

a second output buffer having a single, non-inverting input of high impedance which is connected to the combined outputs of the said opposing current mirrors, an open loop voltage gain not exceeding unity, and a low impedance output;

a second current rail traversing through said second output buffer for supplying currents to said second buffer's low impedance output;

a third, higher set of dual, opposing high voltage supply rails for supplying currents to both said current rail of said output buffer and the inputs of the said second set of regulated high voltage supply rails; and, a feedback means is connected from the said second buffer's output to the load resistor of said first input buffer.

48. An electrical circuit as defined in claim 47 with bias means to minimize or eliminate common crossover distortion.

49. An electrical circuit as defined in claim 47 for use at different power levels wherein said amplifier circuits are designed and used for very low power signals, low and medium power signals, as well as high and very high power signals of complex, wideband wave shapes.

50. An electrical circuit as defined in claim 47 wherein said amplifier circuits are designed and used for audio signals, at any or all appropriate power levels used therein.

51. An electrical circuit as defined in claim 47 wherein said amplifier circuits are designed and used for servo control loop signals, at any or all appropriate power levels used therein.

52. An electrical circuit as defined in claim 47 wherein said amplifier circuits are designed and used for robotic control loop signals at any or all appropriate power levels used therein.

* * * * *

(12) EX PARTE REEXAMINATION CERTIFICATE (6957th)
United States Patent
Bender

(10) Number: US 5,103,188 C1
(45) Certificate Issued: Jul. 28, 2009

(54) BUFFERED TRANSCONDUCTANCE AMPLIFIER

(76) Inventor: Gregory Bender, Studio 14, 2934 Ford St., Oakland, CA (US) 94601

Reexamination Request:
No. 90/010,058, Nov. 21, 2007

Reexamination Certificate for:
Patent No.: 5,103,188
Issued: Apr. 7, 1992
Appl. No.: 07/389,735
Filed: Aug. 4, 1989

Related U.S. Application Data

(62) Division of application No. 06/841,322, filed on Mar. 19, 1986, now Pat. No. Des. 305,895.

(51) Int. Cl.
*H03F 3/20* (2006.01)
*H03F 3/30* (2006.01)
*H03F 3/21* (2006.01)

(52) U.S. Cl. ............... 330/265; 330/257; 330/267
(58) Field of Classification Search ............... None
See application file for complete search history.

(56) References Cited

U.S. PATENT DOCUMENTS

| | | | |
|---|---|---|---|
| 4,464,634 A | 8/1984 | Velazquez |
| 4,483,016 A | 11/1984 | Hochstein |
| 4,502,020 A | 2/1985 | Nelson |
| 4,757,271 A | 7/1988 | Beale |
| 4,833,423 A | 5/1989 | Molloy |
| 4,893,091 A | 1/1990 | Lillis |

OTHER PUBLICATIONS

Elantec Inc., Jan. 1988 Databook; Monolithic & Hybrid Integrated Circuits, pp. 160–172.
Elantec Inc., Jan. 1988 Databook; Monolithic & Hybrid Integrated Circuits, pp. 69, 80–103.
Frank Goodenough, Low–Cost IC Amp Carries Video, Electronic Design, Apr. 16, 1987, vol. 35, No. 10, pp. 59–60.
Glyn Jones, Transimpedance Design Yields Low Cost Video Driver, Electronics Product Design, Sep. 1987, pp. 63–64.
Precision Monolithics Inc., Dec. 1988 Datasheet, pp. 1–15 (Rev. B 1988).
Precision Monolithics Inc., Jan. 1988 Databook, pp. 5–54, 5–138, 5–207, 5–120, 5–281, 5–303, 5–311, 5–320, 5–324 to 5–325 (Rev. A 1988).
Derek Bowers, A Precision Dual "Current Feedback" Operational Amplifier, IEEE 1988 Bipolar Circuits & Technology Meeting Conference Proceedings, Sep. 13, 1988, at Paper 4.1, pp. 68–70.

(Continued)

*Primary Examiner*—James Menefee

(57) ABSTRACT

An electrical circuit for amplifying complex, wideband signals, preferably audio and servo/robotic signals, comprises a first input buffer in an emitter-follower configuration or in a source-follower configuration. A bias current rail traverses the first buffer. The low impedance output of the first buffer is connected to a load resistor, preferably in the order of 50-500 ohms. The circuit further comprises positive and negative opposing current mirrors connected to the bias current rail that reflect the currents created in the bias current rail by an input voltage signal imposed across the load resister. The combined outputs of the current mirrors are connected to the input of a second buffer. The output of the second buffer is connected via a feedback means to the output of the first buffer and to a load. The first buffer is driven by dual voltage supply rails, preferably a lower voltage, in the order of 15 Volts. Higher dual voltage supply rails for the second buffer and the opposing current mirrors, typically at least 50 to 70 Volts, are used for power amplifiers. The present invention provides an amplifier which can amplify complex, high speed, wideband signals without slew rate, overshoot, or ringing and still maintain a large degree of linearity with increasing input overdrive. It is capable of unprecedented high frequency response and phase stability without any need for typical compensation techniques.

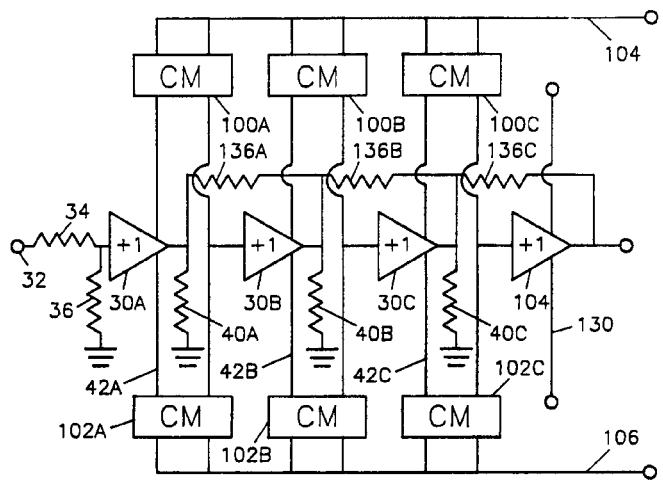

OTHER PUBLICATIONS

Analog Devices, Inc., Linear Products Databook, pp. 2–165 to 2–175 (Apr. 1988).

Wyn Palmer & Barry Hilton, A 500V/us 12 bit Transimpedance Amplifier, IEEE International Solid State Circuits Conference, Session XIV, 1987, at 176–77, 389.

Jim Williams, Composite Amplifiers Yield High Speed and Low Offset, EDN, Jan. 22, 1987, vol. 32, No. 2, pp. 139–150.

Jim Williams, Circuitry for High Speed Amplifiers, 1986 Wescon Proceedings: Utilizing Advances in High–Speed Amplifiers, 15/5 (Nov. 18–20, 1986 Anaheim, California).

Linear Technology Corp., Linear Databook of 1986, pp. 2–59–2–73 (1987).

Jim Williams, Power Gain Stages for Monolithic Amplifiers, Application Note 18, Mar. 1986; Linear Technology Corp., Linear Applications Handbook: A Guide to Linear Circuit Design 1987, pp. AN18–1–AN18–5 (1988).

David Nelson, Op Amps for Wideband, Fast Settling Applications, 1986 Wescon Proceedings: Utilizing Advances in High–Speed Amplifiers, 15/4 (Nov. 18–20, 1986 Anaheim, California).

Comlinear Corp., Application Note 200–1: Designer's Guide for 200 Series Op Amps, (Oct. 1988); Comlinear Corp., 1989 Databook: Solutions with Speed, pp. 12–13 to 12–20 (Jan. 1989).

Comlinear Corp., 1989 Databook: Solutions with Speed, pp. 2–7 to 2–10 (Jan. 1989); Comlinear Corp., Fast Settling, Wideband Operational Amplifiers: CLC200AI, CLC200AM (Hi–Rel) (Oct. 1988).

Comlinear Corp., 1989 Databook: Solutions with Speed, pp. 2–19 to 2–22 (Jan. 1989). Comlinear Corp., Overdrive–Protected Wideband Op Amp: CLC205 (Oct. 1988).

Gregory Bender, Bender's Claim of Infringement Letter Sent to Texas Instruments. May 30, 2006.

Harold, Peter; Current–Feedback Op Amps Ease High–Speed Circuit Design; EDN, vol. 13, No. 14, Jul. 7, 1988; pp. 84–94.

Sedra, Adel S. et al.; Microelectronic Circuits (2nd ed 1987).

Horowitz, Paul et al; The Art of Electronics, 1980.

Bengiamin, Nagy N.; Measuring Object Location with Load Cells, IEEE Controls Systems Magazine, 1987; pp. 58–60.

Fleming, Tarleton; Monolithic Instrumentation Amplifiers Save Space without Sacrificing Performance; EDN; Mar. 20, 1986; p. 57–66.

EX PARTE REEXAMINATION CERTIFICATE ISSUED UNDER 35 U.S.C. 307

THE PATENT IS HEREBY AMENDED AS INDICATED BELOW

AS A RESULT OF REEXAMINATION, IT HAS BEEN DETERMINED THAT:

The patentability of claims 8–14 and 29–46 is confirmed.

Claims 1–7, 15–28 and 47–52 are cancelled.

* * * * *